(12) United States Patent
Son et al.

(10) Patent No.: US 9,727,412 B2
(45) Date of Patent: Aug. 8, 2017

(54) MEMORY DEVICE HAVING ERROR NOTIFICATION FUNCTION

(71) Applicant: Samsung Electronics Co., Ltd., Suwon-si (KR)

(72) Inventors: Jong-Pil Son, Seongnam-si (KR); Chul-Woo Park, Yongin-si (KR); Seong-Jin Jang, Seongnam-si (KR); Hoi-Ju Chung, Yongin-si (KR); Sang-Uhn Cha, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 75 days.

(21) Appl. No.: 14/729,656

(22) Filed: Jun. 3, 2015

(65) Prior Publication Data

US 2016/0055056 A1 Feb. 25, 2016

(30) Foreign Application Priority Data

Aug. 21, 2014 (KR) .......................... 10-2014-0109040

(51) Int. Cl.
| | |
|---|---|
| *G06F 11/00* | (2006.01) |
| *G06F 11/10* | (2006.01) |
| *G06F 11/16* | (2006.01) |
| *G11C 29/04* | (2006.01) |

(52) U.S. Cl.
CPC ...... *G06F 11/1008* (2013.01); *G06F 11/1024* (2013.01); *G06F 11/1068* (2013.01); *G06F 11/1666* (2013.01); *G06F 11/1004* (2013.01); *G11C 2029/0411* (2013.01)

(58) Field of Classification Search
CPC .... G06F 11/08; G06F 11/108; G06F 11/1004; G06F 11/1024; G06F 11/27; G06F 11/1048; G06F 2212/304; G06F 11/1008; G06F 11/1068

See application file for complete search history.

(56) References Cited

U.S. PATENT DOCUMENTS

| | | |
|---|---|---|
| 5,533,036 A | 7/1996 | Blake et al. |
| 7,227,797 B2 | 6/2007 | Thayer et al. |
| 7,305,596 B2 | 12/2007 | Noda et al. |
| 8,327,223 B2 | 12/2012 | Otterstedt |
| 8,499,206 B2 | 7/2013 | Cho et al. |
| 8,677,203 B1 | 3/2014 | Shalvi et al. |
| 2007/0255981 A1* | 11/2007 | Eto ................... G06F 11/1008 714/710 |
| 2010/0107036 A1 | 4/2010 | Resnick |
| 2011/0041016 A1* | 2/2011 | O'Connell .......... G06F 11/1048 714/711 |

(Continued)

*Primary Examiner* — Shelly A Chase
(74) *Attorney, Agent, or Firm* — Muir Patent Law, PLLC

(57) ABSTRACT

A memory device having an error notification function includes an error correction code (ECC) engine detecting and correcting an error bit by performing an ECC operation on data of the plurality of memory cells, and an error notifying circuit configured to output an error signal according to the ECC operation. The ECC engine outputs error information corresponding to the error bit corresponding to a particular address corrected by the ECC operation. The error notifying circuit may output the error signal when the particular address is not the same as any one of existing one or more failed addresses.

16 Claims, 16 Drawing Sheets

(56) References Cited

U.S. PATENT DOCUMENTS

| | | |
|---|---|---|
| 2012/0317352 A1 | 12/2012 | Kang et al. |
| 2013/0179751 A1 | 7/2013 | Linstadt |
| 2013/0227344 A1* | 8/2013 | Sohn ..................... G06F 11/27 |
| | | 714/6.21 |
| 2013/0279249 A1 | 10/2013 | Yun et al. |
| 2013/0305123 A1 | 11/2013 | Billing et al. |
| 2013/0346671 A1 | 12/2013 | Michael et al. |
| 2014/0013183 A1 | 1/2014 | Sohn et al. |

* cited by examiner

FIG. 6

|  | FADD | |
|---|---|---|
| FRA[0:m] | FCA[0:n] | |
| 0001100 | 00111010 |
| 0001100 | 00111011 |
| 0001101 | 10010011 |
| 1001101 | 10010011 |
| 0001100 | 10110011 |
| ⋮ | ⋮ |
| 0001100 | 10110111 |
| 1001111 | 10010011 |

MEMORY DEVICE HAVING ERROR NOTIFICATION FUNCTION

CROSS-REFERENCE TO RELATED APPLICATION

This application claims the benefit of priority to Korean Patent Application No. 10-2014-0109040, filed on Aug. 21, 2014, in the Korean Intellectual Property Office, the disclosure of which is incorporated herein in its entirety by reference.

BACKGROUND

The present disclosure relates to a semiconductor memory device, and more particularly, to a memory device performing an error notification function so that a system is informed of an error situation in the memory device.

Semiconductor memory devices may repair failed cells that are generated during a manufacturing process. Repaired failed cell information, that is, existing failed cell information, which is provided by a manufacturer of memory devices, may be notified in advance to a system that includes the memory devices. A system engineer may determine the specifications of the system based on the repaired failed cell information. The memory devices may repair failed cells that are additionally generated while the memory devices are mounted and being used in the system. The memory devices may perform error correction code (ECC) operations to detect and correct error bits resulting from additional failed cells. Since the additional failed cells are repaired inside the memory devices without notifying the system, operations of the system are not affected at all. However, if too many additional failed cells are repaired in the memory devices, the repairing process may affect the operations of the system. If the system monitors information regarding the additional failed cells in the memory devices, proper countermeasures regarding additional failed cells may be prepared in advance, and thus, the system may be stabilized.

SUMMARY

The present disclosure provides a memory device performing an error notification function so that a system is informed of an error situation in the memory device, an operation method of the memory device, and a memory system.

According to an aspect of the inventive concept, there is provided a memory device including a memory cell array comprising a plurality of memory cells; a storing circuit configured to store one or more failed address corresponding to one or more failed cells of the plurality of memory cells; an error correction code (ECC) engine configured to detect and correct an error bit related to data of a first set of memory cells of the memory cell array corresponding to a particular address, and output error information corresponding to the error bit corresponding to the particular address; and an error notifying circuit configured to output an error signal when the particular address is not the same as any one of the one or more failed addresses.

The one or more failed addresses of the storing circuit may be determined during a testing process of a manufacturing process of the memory device.

The storing circuit may be a one-time programmable memory, such as an anti-fuse array, or a non-volatile memory cell array.

The error notifying circuit may be configured to output the error signal to an outside of the memory device via a data input/output pin of the memory device.

The error notifying circuit may be configured to output the error signal to an outside of the memory device via a dedicated pin.

The error notifying circuit may be configured to output the error signal when the particular address is the same as one of the one or more failed addresses, and the first set of memory cells includes more than one bit error.

According to another aspect of the inventive concept, there is provided a memory device including a memory cell array comprising a plurality of memory cells; an ECC engine configured to detect and correct an error bit related to data of the plurality of memory cells; a counter configured to count a number of times of the detected and corrected an error bit during a first period of time; and an error notifying circuit configured to output an error signal when the number of times of the detected and corrected an error bit is greater than a reference value.

The error notifying circuit may be configured to output the number of times of the detected and corrected an error bit to an outside of the memory device via one of a data input/output pin and a dedicated pin of the memory device.

The reference value may be provided from a memory controller that is connected to the memory device.

The number of times of the detected and corrected an error bit may be reset in response to an error count command provided from a memory controller that is connected to the memory device.

According to another aspect of the inventive concept, there is provided a method of operating a memory device including a memory cell array, the method including: storing one or more failed addresses corresponding to one or more failed cells of the memory cell array; by using an error correction code (ECC) circuit, detecting and correcting an error bit related to data of a first set of memory cells of the memory cell array corresponding to a first address, and outputting error information corresponding to the first address; and outputting an error signal when the first address is not the same as any one of the one or more failed addresses.

The method may further include outputting the error signal when the first address is the same as one of the one or more failed addresses, and the first set of memory cells includes more than one bit error.

According to another aspect of the inventive concept, there is provided a method of operating a memory device including a memory cell array, the method including: by using an ECC engine, detecting and correcting an error bit related to data of a plurality of memory cells of a memory cell array, and outputting an ECC flag signal whenever the error bit is detected and corrected; counting the number of the ECC flag signals and generating a number of ECC operations; comparing the number of ECC operations with a maximum number of ECC operations; and outputting an error signal when the number of ECC operations is greater than the maximum number of ECC operations according to a comparison result.

The method may further include generating a duration of counting the number of the ECC flag signals as an ECC count time; and outputting a number of ECC operations that is generated during the ECC count time when the ECC count time is greater than an error monitoring time.

According to another aspect of the inventive concept, there is provided a memory system including a memory controller and a memory device. The memory device may be configured to output an error signal, which notifies that an error bit that is corrected by an ECC operation is not existing one of one or more failed addresses but is an added failed address, to the memory controller. The memory device may include an ECC engine configured to output error information corresponding to the added failed address; and an error notifying circuit may be configured to compare the added failed address with one of the existing one or more failed addresses, and output the error signal when the added failed address is not the same as any one of the existing one or more failed addresses according to a comparison result.

The error notifying circuit may be configured to generate a duration of counting the number of the ECC flag signals as an ECC count time, compare the ECC count time with an error monitoring time, and output a number of ECC operations that is generated during the ECC count time when the ECC count time is greater than the error monitoring time according to a comparison result.

According to another aspect of the inventive concept, there is provided a method of operating a memory device including a memory cell array. The method may include: determining one or more failed addresses corresponding to one or more failed cells of the memory cell array by a test operation of the memory device; by using an error correction code (ECC) circuit, detecting and correcting an error bit related to data of a first set of memory cells of the memory cell array corresponding to a first address; and outputting an error signal when the first address is not the same as any one of the one or more failed addresses, or when the first address is the same as one of the one or more failed addresses and the first set of memory cells includes more than one bit error.

BRIEF DESCRIPTION OF THE DRAWINGS

Exemplary embodiments of the present disclosure will be more clearly understood from the following detailed description taken in conjunction with the accompanying drawings in which:

FIGS. 6 and 7 are diagrams for describing a failed cell information storing circuit of FIG. 1 according to exemplary embodiments;

DETAILED DESCRIPTION OF THE EMBODIMENTS

Figure 1:
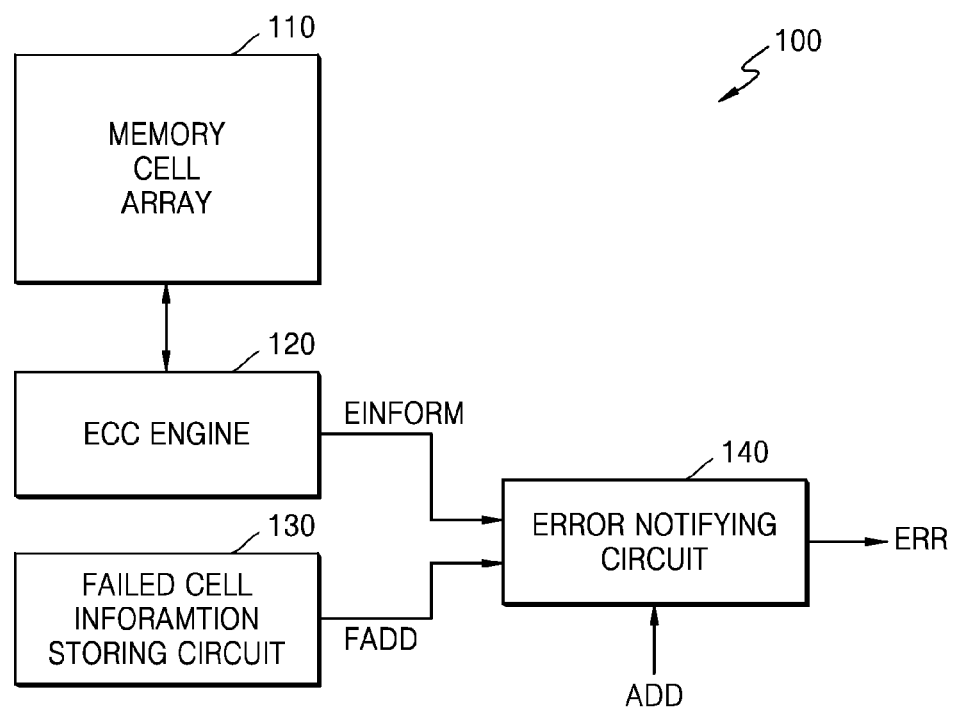
FIG. 1 is a block diagram of a memory device performing an error notification function, according to an exemplary embodiment.

The attached drawings for illustrating preferred embodiments are referred to in order to gain a sufficient understanding, the merits thereof, and the objectives accomplished by the implementation.

The example embodiments will now be described more fully with reference to the accompanying drawings, in which exemplary embodiments of the inventive concept are shown. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope are encompassed in the inventive concept. Like reference numerals refer to like elements throughout. In the drawings, the thicknesses of layers and regions are exaggerated for clarity.

The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including," "having," "includes," "comprises," and/or "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure.

It will be understood that when an element is referred to as being "connected" or "coupled" to another element or on another element, it can be directly connected or coupled to or on the other element or intervening elements may be present. In contrast, when an element is referred to as being "directly connected" or "directly coupled" to another element or on another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless defined otherwise, all terms used in the description including technical or scientific terms have the same meaning as generally understood by one of ordinary skill in the art. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory device 100 performing an error notification function, according to an exemplary embodiment.

Referring to FIG. 1, the memory device 100 includes a memory cell array 110, an error correction code (ECC) engine 120, a failed cell information storing circuit 130, and an error notifying circuit 140. In certain embodiments, the memory device may be in the form of a semiconductor chip, a semiconductor package including one or more semiconductor chips, or another electronic device such as a package-on-package device.

The memory cell array 110 includes a plurality of memory cells that are arranged in rows and columns. Each memory cell of the memory cell array 110 includes a capacitor that stores charge corresponding to data, and a transistor. The memory device 100, for example, memory cells of dynamic random access memory (DRAM), records data by using the charge stored in the capacitor.

In an embodiment of the present inventive concept, a three-dimensional (3D) memory array may be provided. The 3D memory array is monolithically formed in one or more physical levels of arrays of memory cells having an active area disposed above a substrate, for example, a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array may include vertical NAND strings that are vertically oriented such that at least one memory cell is located above another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; and 8,559,235 and U.S. Pat. Pub. No. 2011/0233648.

Capacitance of the capacitor decreases as process scaling of the DRAM proceeds. Also, due to current leakage in the capacitor, the charge stored in the capacitor may be lost over time even when read and write operations are not performed. Therefore, a bit error rate (BER) may be increased. The memory device 100 may include the ECC engine 120 that performs an ECC operation to repair an error bit (e.g., a bit that has an error).

The ECC engine 120 may perform the ECC operation on a first set of memory cells of the memory cell array 110, which correspond to a particular address received at the memory device 100. The particular address may include an access row address and a column address, which are received from a memory controller along with a command for instructing a write operation or a read operation. The ECC operation may include calculating parity bits, detecting and correcting an error bit, and outputting error information EINFORM that may include whether the ECC operation has been performed and how many error bits are included.

The ECC engine 120 may generate parity bits related to data bits that are written to the memory cells of the memory cell array 110, based on data bits that are read from the memory cells of the memory cell array 110, detect and correct an error bit in read data bits by using the parity bits, and output an address of the memory cells that output a read data bit, which includes the error bit, as the error information EINFORM. In one embodiment, the error information EINFORM may include whether the ECC engine 120 has detected and corrected the error bit and whether the first set of memory cells includes more than one bit error.

The failed cell information storing circuit 130 may store one or more failed addresses corresponding to one or more failed cells of the memory cell array 110. The one or more failed cells that are generated during a manufacturing process of the memory device 100 may be screened during a testing process. Existing one or more failed cells that are screened during the testing process may be repaired by using redundancy cells or by performing the ECC operation. The one or more failed addresses corresponding to the existing one or more failed cells that are determined and repaired by the ECC operation may be stored in the failed cell information storing circuit 130 while a manufacturing of the memory device 100 is proceeding.

According to an embodiment, the failed cell information storing circuit 130 may be a one-time programmable memory, such as a laser-programmable fuse array, an anti-fuse array, or an electrically programmable fuse array, or a non-volatile memory cell array, such as magnetic random access memory (MRAM) cells, resistance random access memory (RRAM) cells, phase change random access memory (PRAM) cells, or flash memory cells.

In one embodiment, the error notifying circuit 140 may receive the error information EINFORM, the one or more failed addresses FADD, and a particular address on which the ECC operation has been performed, and determine whether an error signal ERR outputs to an outside of the memory device 100 in response to the error information EINFORM, the particular address, and existing one or more failed addresses FADD that are stored in the failed cell information storing circuit 130. If the ECC engine 120 has detected and corrected an error bit related to data of a first set of memory cells of the memory cell array corresponding to a particular address, and the particular address is not the same as one of the one or more failed address, the error notifying circuit 140 may output an error signal ERR. In this case, the memory device 100 may include one or more additional failed cells that are newly added while using the memory device 100.

The error signal ERR of the error notifying circuit 140 may be transmitted to an outside of the memory device 100. The error signal ERR may be transmitted to a memory controller or a memory buffer. The error signal ERR may be transmitted to the memory controller or the memory buffer via a data input/output (I/O) pin (DQ pin) of the memory device 100. According to an embodiment, the error signal ERR may be transmitted to the memory controller or the memory buffer via a dedicated pin (e.g., an error signal pin) of the memory device 100.

Figure 2:
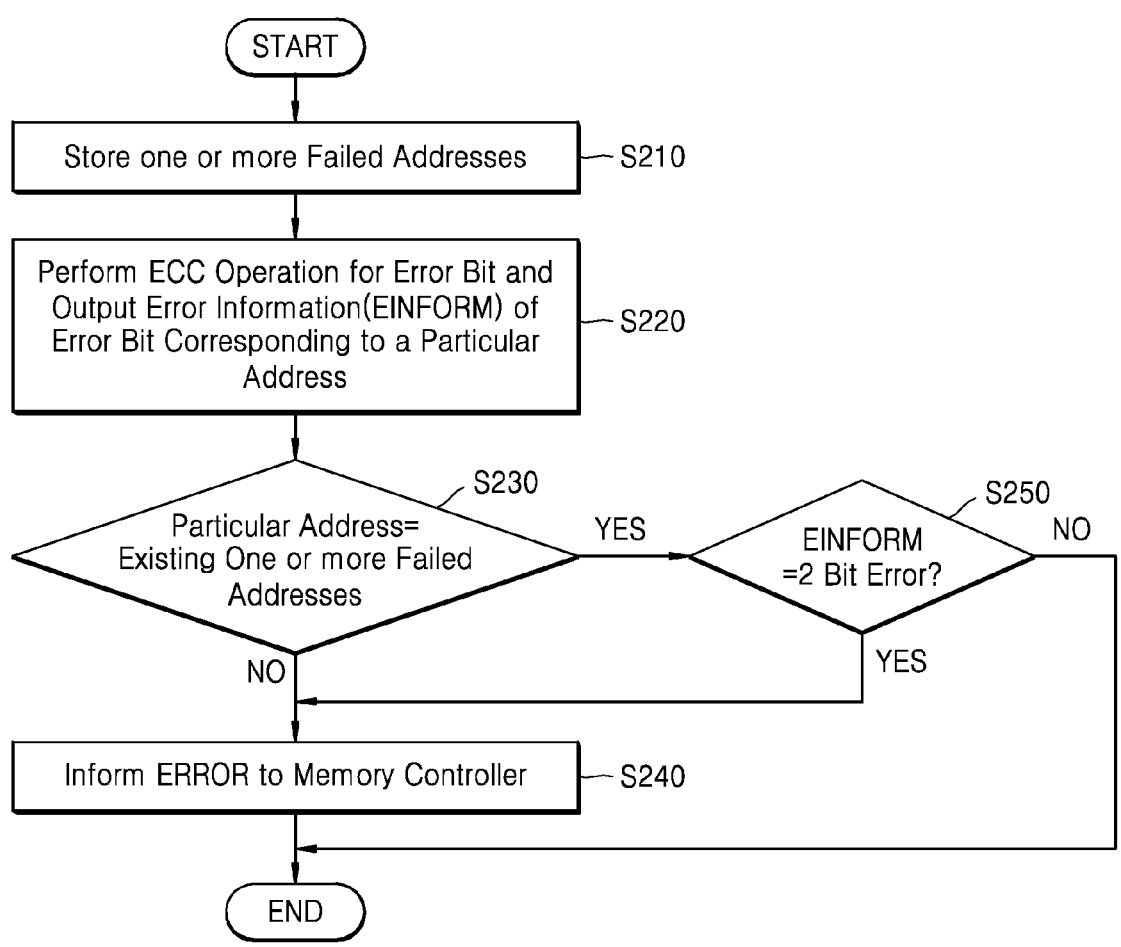
FIG. 2 is a flowchart of an operation method of the memory device of FIG. 1 according to an exemplary embodiment.

FIG. 2 is a flowchart of an operation method of the memory device 100 of FIG. 1 according to an exemplary embodiment.

Referring to FIGS. 1 and 2, whether memory cells of the memory cell array 110 are good or bad may be tested during a testing process of the memory device 100. The memory device 100 may store one or more failed address regarding one or more failed cells that have been screened during the testing process, in the failed cell information storing circuit 130 (S210). Each of the one or more failed cells refers to an address including 1-bit error from data written to or read from a single memory cell of the memory cell array 110. Each one of the one or more failed addresses of the failed cell information storing circuit 130 may be preset to repair a 1-bit error by the ECC engine 120 and may be provided to a memory controller or a memory buffer as existing one or more failed addresses.

The memory device 100 may receive a write command or a read command from the memory controller or the memory buffer. By using the ECC engine 120, the memory device 100 may detect an error bit from the data written to or read from the memory cell array 110 according to the write command or the read command. The ECC engine 120 may perform the ECC operation to correct the detected error bit and output error information EINFORM that corresponds to the detected error bit corresponding to a particular address (S220).

The memory device 100 may determine whether the particular address is the same as one of the existing one or more failed addresses of the failed cell information storing circuit 130 (S230). The memory device 100 may compare the particular address and one of the existing one or more failed addresses and then determine whether the particular address is one of the existing one or more failed addresses or a newly added failed address.

According to a comparison result (S230), if the particular address is not the same as any one of the existing one or more failed addresses (NO), the memory device 100 may generate the error signal ERR and output the error signal ERR to the memory controller or the memory buffer (S240). The memory controller or the memory buffer that has received the error signal ERR may determine that the address of the error bit generated in the memory device 100 is not the existing failed cell information but is newly added failed cell information.

The memory controller or the memory buffer that has received the error signal ERR may monitor a generation frequency of the error signal ERR and determine whether or not the memory device 100 is appropriate for usage. If the memory device 100 is not appropriate for usage according to a determination result, the memory device 100 may be replaced. Therefore, since the memory device 100 may be replaced before the memory device 100 malfunctions, a system including the memory device 100 may be stabilized.

According to a comparison result (S230), if the particular address is the same as one of the existing one or more failed addresses (YES), the memory device 100 may determine that the particular address, on which the ECC operation is performed, corresponds to one of the existing one or more failed addresses. The ECC operation of the memory device 100 may use single bit error correction and double bit error detection (SECDED) codes. The memory device 100 may determine whether the error information EINFORM corresponding to the error bit corresponding to a particular address includes a 1-bit error or a 2-bit error (S250). If the error information EINFORM corresponding to the error bit of the particular address includes a 1-bit error, the memory device 100 may identify that the error bit corresponding to the particular address can be corrected. Otherwise, if the error information EINFORM corresponding to the error bit corresponding to the particular address includes a more than 1-bit error (e.g., a 2-bit error), the error bit corresponding to the particular address cannot be corrected and the error information EINFORM means that a newly added failed address has occurred.

According to a determination result (S250), if the error information EINFORM is determined as a 1-bit error (NO), the memory device 100 may determine that the ECC operation has been performed according to one of the existing one or more failed addresses that is stored in the failed cell information storing circuit 130.

According to a determination result (S250), if the error information EINFORM is determined as more than 1-bit error (e.g., a 2-bit error) (YES), the memory device 100 may generate the error signal ERR and output the error signal ERR to the memory controller or the memory buffer (S240). The memory controller or the memory buffer that has received the error signal ERR may determine that the address of the error bit generated in the memory device 100 is not the same as any one of the existing one or more failed addresses, and is a newly added failed address.

According to the operation method of the memory device 100, if the particular address of the error bit, on which the ECC operation is performed, is not the same as any one of the existing one or more failed addresses, the error signal ERR may be output so that the memory controller or the memory buffer may identify that the particular address of the error bit is the newly added failed address. Accordingly, since an error situation of the memory device 100 may be monitored by a system that includes the memory controller or the memory buffer, the performance of the system may be stabilized.

Figure 3:
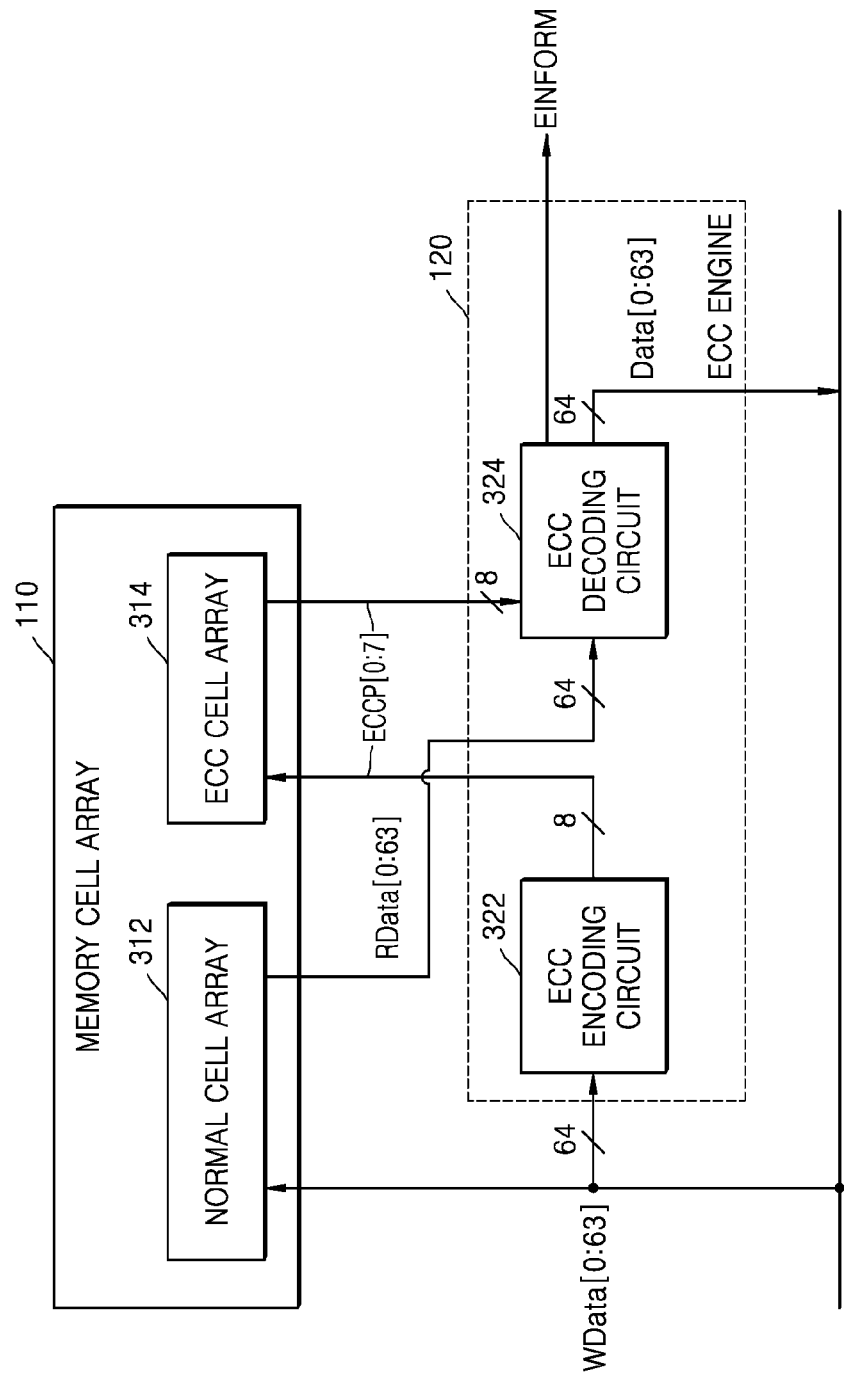
FIG. 3 is a block diagram of an error correction code (ECC) engine of FIG. 1 according to an exemplary embodiment.

FIG. 3 is a block diagram of the ECC engine 120 of FIG. 1 according to an exemplary embodiment.

Referring to FIG. 3, the ECC engine 120 may perform the ECC operation to repair an error bit included in data written to or read from a single memory cell of the memory cell array 110. A unit of data bits may be set as any one of 8 bits, 16 bits, 32 bits, 64 bits, or 128 bits. According to the present embodiment, the unit of data bits is set as 64 bits.

The ECC engine 120 may include an ECC encoding circuit 322 and an ECC decoding circuit 324. The ECC encoding circuit 322 may generate parity bits ECCP[0:7] related to write data WData[0:63] that is to be written to memory cells of the memory cell array 110. The parity bits ECCP[0:7] may be stored in the memory cell array 110. For convenience of description, a memory cell array that stores the parity bits ECCP[0:7] is referred to as an ECC cell array 314, and a memory cell array that stores the write data WData[0:63] is referred to as a normal cell array 312.

The ECC decoding circuit 324 may correct an error bit included in read data RData[0:63] by using the read data RData[0:63] read from the normal cell array 312 and the parity bits ECCP[0:7] read from the ECC cell array 314, and output error corrected data Data[0:63]. In one embodiment, the ECC decoding circuit 324 may output the error information EINFORM.

Figure 4:
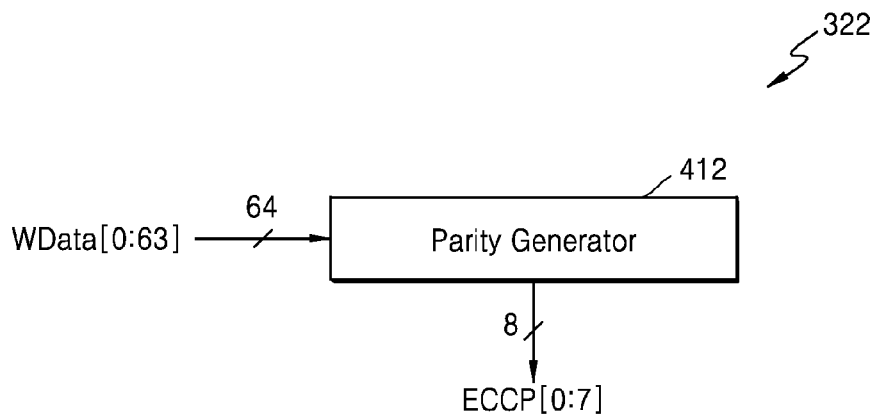
FIG. 4 is a diagram of an ECC encoding circuit of FIG. 3 according to an exemplary embodiment.

FIG. 4 is a diagram of the ECC encoding circuit 322 of FIG. 3 according to an exemplary embodiment.

Referring to FIG. 4, the ECC encoding circuit 322 may include a parity generator 412 that receives 64-bit write data WData[0:63] and generates the parity bits ECCP[0:7] by performing, for example, an XOR operation.

Figure 5:
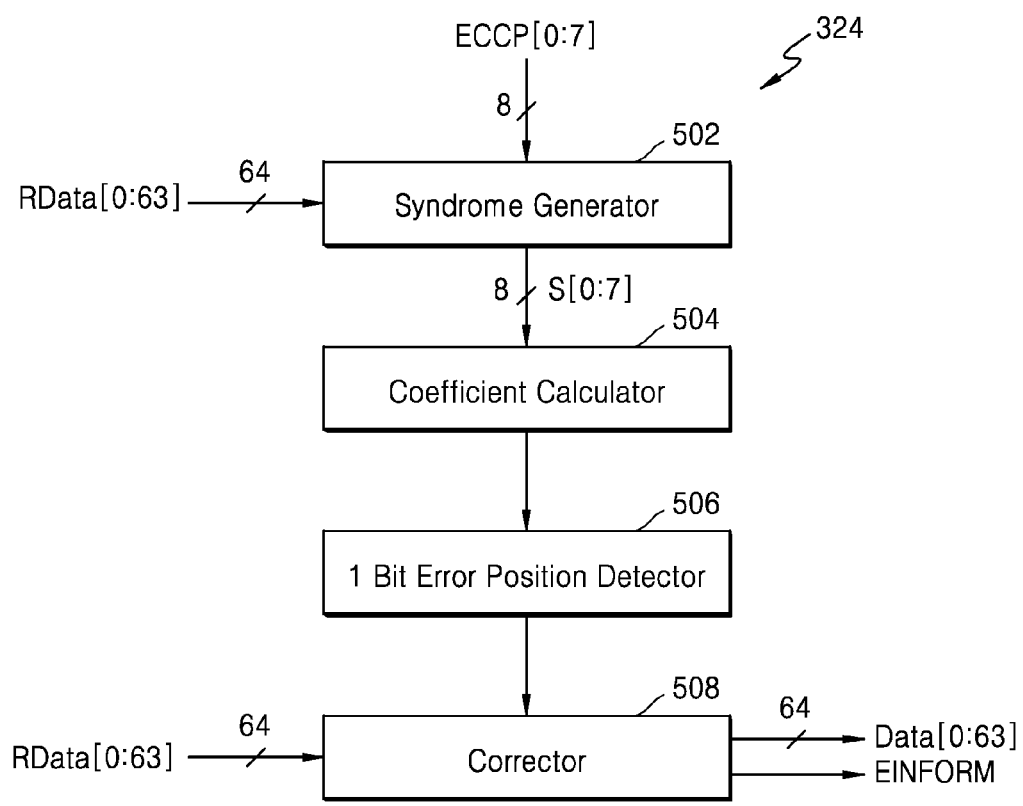
FIG. 5 is a diagram of an ECC decoding circuit of FIG. 3 according to an exemplary embodiment.

FIG. 5 is a diagram of the ECC decoding circuit 324 of FIG. 3 according to an exemplary embodiment.

Referring to FIG. 5, the ECC decoding circuit 324 may include a syndrome generator 502, a coefficient calculator 504, a 1-bit error position detector 506, and an error corrector 508. The syndrome generator 502 may receive 64-bit read data RData[0:63] and 8-bit parity bits ECCP[0:7] and generate syndrome data S[0:7] by performing an XOR operation. The coefficient calculator 504 may calculate a coefficient of an error position equation by using the syndrome data S[0:7]. The error position equation uses a reciprocal number of an error bit as a root. The 1-bit error position detector 506 may calculate a position of a 1-bit error by using the calculated coefficient of the error position equation.

The error corrector 508 may determine the position of the 1-bit error based on a detection result of the 1-bit error position detector 506 and output error information EINFORM. According to position information of the 1-bit error, the error corrector 508 may correct the 1-bit error by reversing a logic value of a bit from the 64-bit read data RData[0:63] in which the error has occurred and output error-corrected 64-bit data Data[0:63].

Figure 7:
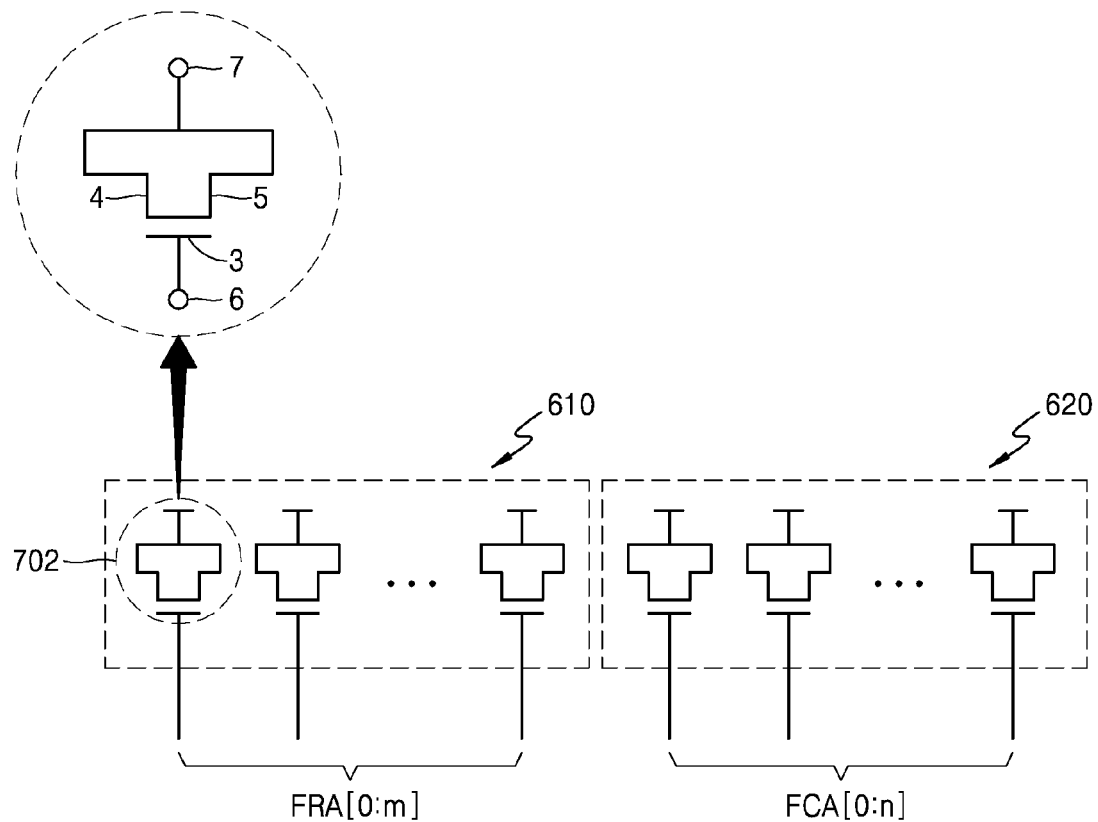

FIGS. 6 and 7 are diagrams for describing the failed cell information storing circuit 130 of FIG. 1 according to exemplary embodiments.

Referring to FIG. 6, the failed cell information storing circuit 130 includes a row address storing circuit 610 and a column address storing circuit 620. The row address storing circuit 610 may store one or more row addresses FRA[0:m] corresponding to one or more failed cells, and the column address storing circuit 620 may store one or more column addresses FCA[0:n] corresponding to the one or more failed cells.

Referring to FIG. 7, each of the row address storing circuit 610 and the column address storing circuit 620 may be configured as an anti-fuse array that includes a plurality of anti-fuses 702. Each of the plurality of anti-fuses 702 has an electric property that is opposite to a fuse, that is, is a resistive fuse having a high resistance value when it is not programmed and a low resistance value when it is programmed.

Each of the plurality of anti-fuses 702 is generally formed by inserting a dielectric between conductors. Each of the plurality of anti-fuses 702 is programmed by breakdown the dielectric between the conductors by applying a high voltage through the conductors at both ends of each of the plurality of anti-fuses 702. As a result of the programming, the conductors at the both ends of each of the plurality of anti-fuses 702 may be short-circuited and have a low resistance value.

Each of the plurality of anti-fuses 702 may be configured as a depletion-type MOS transistor in which a source 4 and a drain 5 are connected. In an initial state, a resistance between a first node 6, which is connected to a gate electrode 3, and a second node 7, which is commonly connected to the source 4 and the drain 5, may be very large because the first and second nodes 6 and 7 are separated by a gate oxide layer. Therefore, the first node 6 and the second node 7 may be non-conducted. For example, this state may be set as logic "low," that is, a non-programmed state.

Each of the plurality of anti-fuses 702 may be irreversibly converted to a conducting state from a non-conducting state by applying a high voltage between the first node 6 and the second node 7 and thus the gate oxide layer is broken. When the gate oxide layer is broken, the resistance between the first node 6 and the second node 7 may be reduced. This state may be set as logic "high".

The row address storing circuit 610 and the column address storing circuit 620 may selectively program the plurality of anti-fuses 702 to store the one or more row addresses FRA[0:m] and the one or more column addresses FCA[0:n] of existing failed cells generated during the manufacturing process of the memory device 100 of FIG. 1. The one or more row addresses FRA[0:m] and the one or more column addresses FCA[0:n] of the existing failed cells may be stored as one or more failed addresses FADD of the failed cell information storing circuit 130 of FIG. 1.

Figure 8:
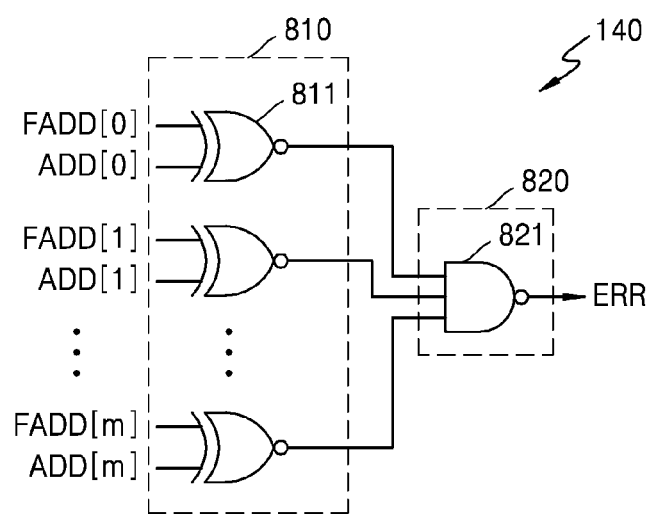
FIG. 8 is a block diagram for describing an error notifying circuit of FIG. 1 according to an exemplary embodiment.

FIG. 8 is a block diagram for describing the error notifying circuit 140 of FIG. 1 according to an exemplary embodiment.

Referring to FIG. 8, the error notifying circuit 140 may include an address comparing circuit 810 and an error signal output circuit 820. The address comparing circuit 810 may include XNOR gates 811 that compare respective bits of a failed address FADD and respective bits of a particular address ADD of FIG. 1. The error signal output circuit 820 may include a NAND gate 821 to which outputs of the XNOR gates 811 are input. An output of the NAND gate 821 may be an error signal ERR.

The error notifying circuit 140 may compare respective bits of the failed address FADD and respective bits of the particular address ADD, and if any pair of the corresponding bits of the failed address FADD and the particular address ADD are not the same, the error signal ERR may be activated at a logic "high" level. When the error signal ERR is activated, the error signal ERR indicates that the particular address ADD is not the same as any one of the existing one or more failed addresses but is a newly added failed address. The error signal ERR may be transmitted to a memory controller or a memory buffer.

The memory controller or the memory buffer that has received the error signal ERR may detect that an address of an error bit generated in the memory device 100 is not the same as any one of the existing one or more failed addresses but is the newly added failed address. A system including the memory controller or the memory buffer may monitor an error situation of the memory device 100, and thus, the performance of the system may be stabilized.

Figure 9:
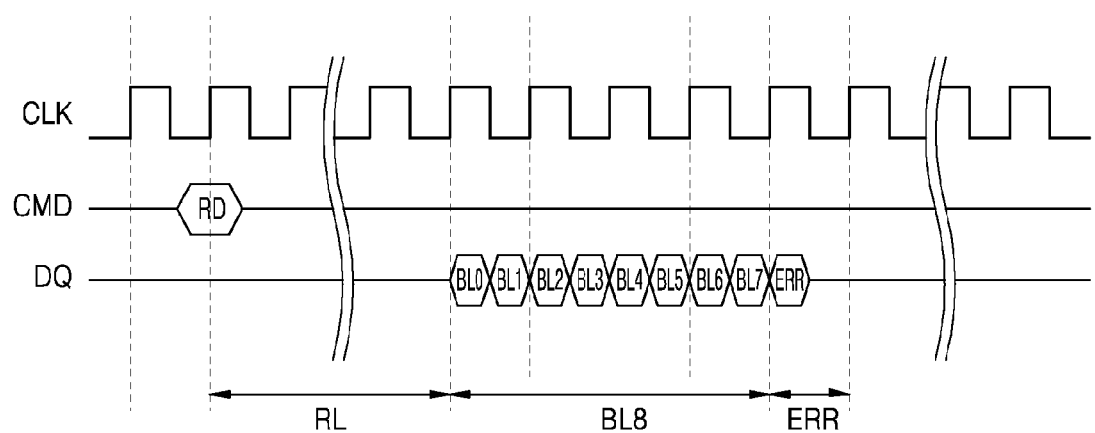
FIGS. 9 and 10 are timing diagrams of a method of transmitting an error signal of a memory device, according to exemplary embodiments.
Figure 10:
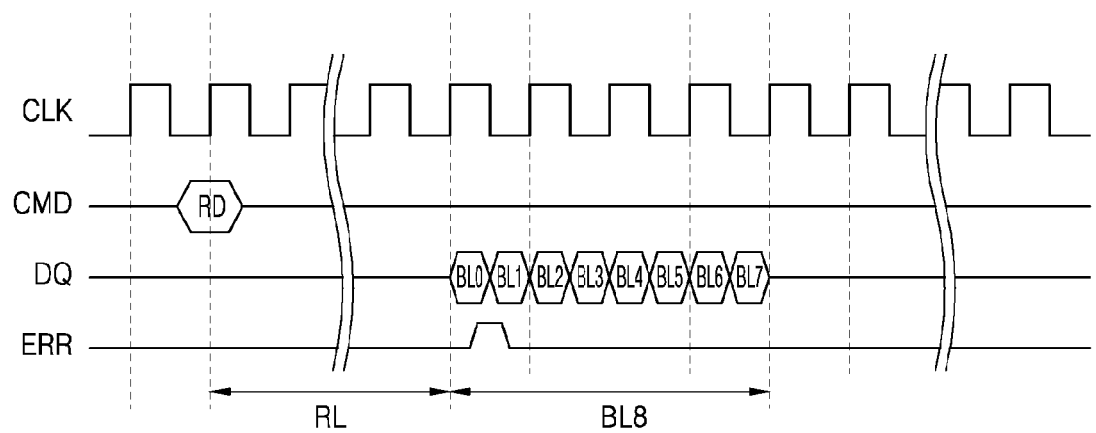

FIGS. 9 and 10 are timing diagrams of a method of transmitting an error signal ERR of the memory device 100, according to exemplary embodiments.

Referring to FIGS. 1 and 9, the memory device 100 may transmit an error signal ERR, which informs that an address of an error bit, which is corrected by an ECC operation, is not the same as any one of the existing failed addresses but is a newly added failed address, to a memory controller or a memory buffer via a data I/O pin DQ. The error notifying circuit 140 of the memory device 100 may output the error signal ERR through the data I/O pin DQ to notify the memory controller or the memory buffer that the address of the corrected error bit is newly added while using the memory device 100.

The memory device 100 may receive a read command RD from the memory controller and may output read data, which corresponds to a burst length BL after read latency RL, through the data I/O pin DQ according to the read command RD that is synchronized with a clock signal CLK. For example, read data BL0 to BL7 that corresponds to a burst length BL=8 may be output through the data I/O pin DQ according to rising and falling edges of the clock signal CLK.

In one embodiment, the memory device 100 may output the error signal ERR, which informs that the error bit that is corrected by the ECC operation is the newly added failed address, through the data I/O pin DQ after the read data BL0 to BL7. For example, the error signal ERR may be output as 1-bit data according to a rising edge or a falling edge of the clock signal CLK.

Referring to FIG. 10, FIG. 10 is different from FIG. 9 in that the error signal ERR is transmitted to the memory controller or the memory buffer via a dedicated pin (e.g., an error signal ERR pin) for the error signal ERR. The error signal ERR may be output to the error signal ERR pin according to the rising edge or the falling edge of the clock signal CLK while the read data BL0 to BL7 is output. The present embodiment illustrates that the error signal ERR is output according to a falling edge of the clock signal CLK where read data corresponding to a second burst length BL1 is output. According to embodiments, the error signal ERR may be output according to rising edges or falling edges of the clock signal CLK when read data corresponding to a first burst length BL0 and third to eighth burst lengths BL2 to BL7 is output.

Figure 11:
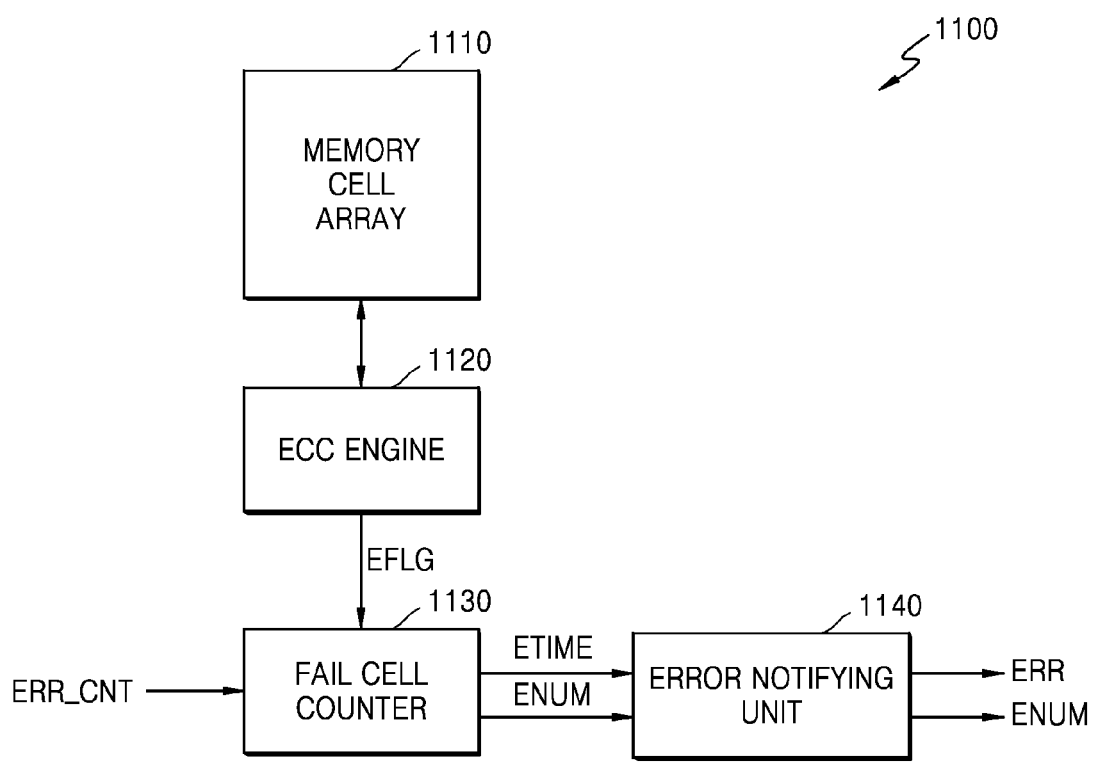
FIG. 11 is a block diagram of a memory device performing an error notification function, according to another exemplary embodiment.

FIG. 11 is a block diagram of a memory device 1100 performing an error notification function, according to another exemplary embodiment.

Referring to FIG. 11, the memory device 1100 includes a memory cell array 1110, an ECC engine 1120, a fail cell counter 1130, and an error notifying circuit 1140.

The memory cell array 1110 includes a plurality of memory cells that are arranged in rows and columns. The ECC engine 1120 may perform an ECC operation on a first set of memory cells of the memory cell array 1110 corresponding to a particular address. The ECC operation may include calculating parity bits, detecting and correcting an error bit, and outputting an ECC flag signal EFLG whenever the error bit is detected and corrected.

The ECC engine 1120 may generate parity bits related to data bits that are written to the memory cells of the memory cell array 1110, based on data bits that are read from the memory cells of the memory cell array 110, detect and correct an error bit that is included in read data bits by using the parity bits, and output the ECC flag signal EFLG whenever the error bit is detected and corrected. The ECC flag signal EFLG may be transmitted to the fail cell counter 1130.

The fail cell counter 1130 may count the number of ECC flag signals EFLG and generate an ECC operation number ENUM, which refers to the number of ECC operations, i.e., detecting and correcting the error bit. The fail cell counter 1130 may reset an ECC count time ETIME and the ECC operation number ENUM in response to an error count command ERR_CNT. The error count command ERR_CNT may be provided from a memory controller. The ECC count time ETIME refers to a duration of counting the ECC flag signal EFLG according to the error count command ERR_CNT. The ECC count time ETIME and the ECC operation number ENUM may be provided to the error notifying circuit 1140.

The error notifying circuit 1140 may compare the ECC operation number ENUM with a maximum number of ECC operations EMAX (e.g., a reference value), and if the ECC operation number ENUM is greater than the maximum number of ECC operations EMAX according to a comparison result, an error signal ERR may be output. The error notifying circuit 1140 may compare the ECC count time ETIME with an error monitoring time TEMT, and if the ECC count time ETIME is greater than the error monitoring time TEMT according to a comparison result, an ECC operation number ENUM that is generated during the ECC count time ETIME may be output.

The error signal ERR and the ECC operation number ENUM of the error notifying circuit 1140 may be transmitted to the outside of the memory device 1100. The error signal ERR and the ECC operation number ENUM may be transmitted to the memory controller. The error signal ERR and the ECC operation number ENUM may be transmitted to the memory controller via a data I/O pin (e.g., DQ pin) of the memory device 1100. According to an embodiment, the error signal ERR may be transmitted to the memory controller via a dedicated pin (e.g., error signal pin) and the ECC operation number ENUM may be transmitted to the memory controller via a dedicated pin (e.g., ECC operation number pin). The two pins may be separate pins, and may be used only as an error signal pin and ECC operation number pin, respectively.

Figure 12:
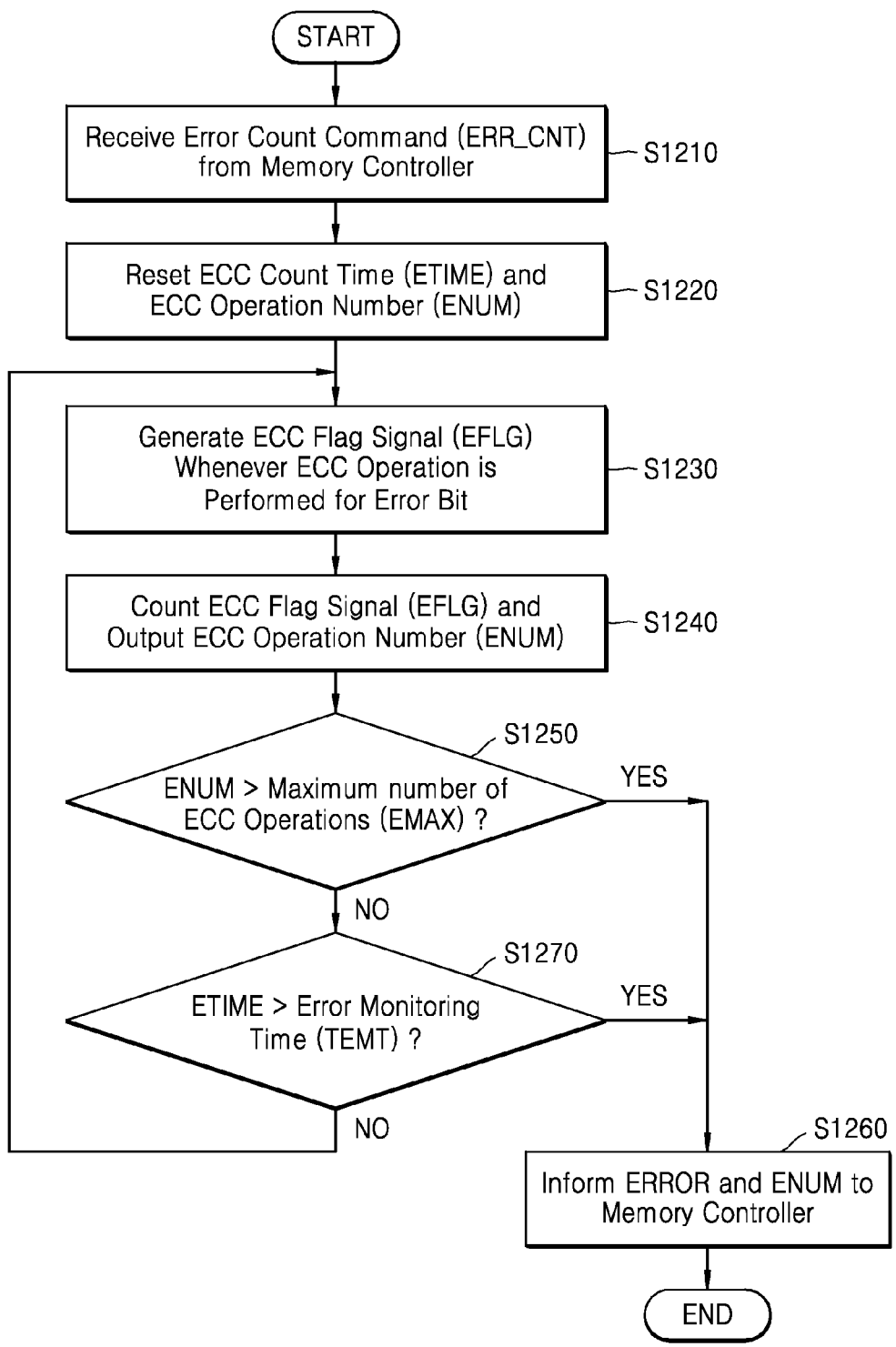
FIG. 12 is a flowchart of an operation method of the memory device of FIG. 11 according to an exemplary embodiment.

FIG. 12 is a flowchart of an operation method of the memory device 1100 of FIG. 11 according to an exemplary embodiment.

Referring to FIG. 12, the memory device 1100 may receive the error count command ERR_CNT from the memory controller (S1210). The error count command ERR_CNT may instruct the memory device 1100 to notify an error situation during a write operation and a read operation to the memory controller.

Along with the error count command ERR_CNT, the memory controller may provide the ECC operation maximum EMAX and the error monitoring time TEMT to the memory device 1100. The ECC operation maximum EMAX refers to the number of ECC operations which does not affect the performance of a system including the memory device 1100 even if the memory device 1100 internally performs detection and correction of an error bit. The error monitoring time TEMT may be provided to stabilize the system. The memory controller may monitor the ECC operation number ENUM generated during the error monitoring time TEMT to stabilize the performance of the system.

The fail cell counter 1130 of the memory device 1100 may reset the ECC count time ETIME and the ECC operation number ENUM in response to the error count command ERR_CNT (S1220).

The memory device 1100 may perform the ECC operation on data bits, which are written to/read from the memory cell array 1110, by using the ECC engine 1120. The ECC engine 1120 may generate parity bits related to data bits that are written to a normal cell array of the memory cell array 1110. The ECC engine 1120 may perform the ECC operation, that is, detect and correct an error bit that is included in data bits read from the normal cell array of the memory cell array 1110, by using parity bits read from an ECC cell array of the memory cell array 1110 (S1230).

The ECC engine 1120 may generate the ECC flag signal EFLG whenever the error bit is detected and correct due to the ECC operation (S1240). The ECC flag signal EFLG may be provided to the fail cell counter 1130. The fail cell counter 1130 may count the number of the ECC flag signals EFLG and generate the ECC operation number ENUM (S1240). The ECC count time ETIME is a duration of the counting operation performed by the fail cell counter 1130.

The error notifying circuit 1140 may determine whether the ECC operation number ENUM is equal to the ECC operation maximum EMAX (S1250). The ECC operation maximum EMAX refers to a maximum number of ECC operations allowed in the system including the memory device 1100 so that the memory device 1100 may internally detect and correct the error bit. If the ECC operation number ENUM is greater than the ECC operation maximum EMAX, the memory device 1100 may have an excessively large number of error bits that are undetectable and uncorrectable by the ECC operation that is performed by the ECC engine 1120. Therefore, the memory device 1100 may not be able to maintain stability.

According to a determination result (S1250), if the ECC operation number ENUM is greater than the ECC operation maximum EMAX (YES), the error notifying circuit 1140 may generate the error signal ERR and output the error signal ERR to the memory controller (S1260). The memory controller that has received the error signal ERR may determine that a large number of uncorrectable error bits has been generated.

The memory controller that has received the error signal ERR may determine that the memory device 1100 is not appropriate for the operations of the system, and thus, replace the memory device 1100. Therefore, the system, including the memory device 1100, may replace the memory device 1100 before the system malfunctions due to the memory device 1100, and thus, the operations of the system may be stabilized.

According to a determination result (S1250), if the ECC operation number ENUM is less than the ECC operation maximum EMAX (NO), the error notifying circuit 1140 may count the number of the ECC flag signals EFLG generated during the error monitoring time TEMT and output the ECC operation number ENUM. The error notifying circuit 1140 may determine whether the ECC count time ETIME is greater than the error monitoring time TEMT (S1270).

According to a determination result (S1270), if the ECC count time ETIME is greater than the error monitoring time TEMT, the ECC operation number ENUM may be output to the memory controller (S1260). The memory controller that receives the ECC operation number ENUM may determine whether the ECC operation number ENUM has a margin according to the operations of the system. If there is no margin according to a determination result, the memory device 1100 may be replaced. Therefore, the operations of the system may be stabilized.

According to a determination result (S1270), if the ECC count time ETIME is not greater than the error monitoring time TEMT, the memory device 1100 may continue performing the ECC operation on the data bits that are written to/read from the memory cell array 1110, by using the ECC engine 1120 (S1230).

According to an operation method of the memory device 1100, according to the present embodiment, if the ECC operation number ENUM, which refers to the number of times that the memory device 1100 has detected and corrected the error bit, is greater than the ECC operation maximum EMAX, the error signal ERR may be output to the memory controller. If the ECC count time ETIME, which refers to the time necessary for the ECC operation of the memory device 1100, is greater than the error monitoring time TEMT, the ECC operation number ENUM may be output to the memory controller. The memory controller may monitor the error signal ERR and the ECC operation number ENUM, determine whether or not the memory device 1100 is not appropriate for the operations of the system, and replace the memory device 1100 when the memory device 1100 is not appropriate. Therefore, since the system, including the memory device 1100 and the memory controller, may monitor the error situation of the memory device 1100, the performance of the system may be stabilized.

Figure 13:
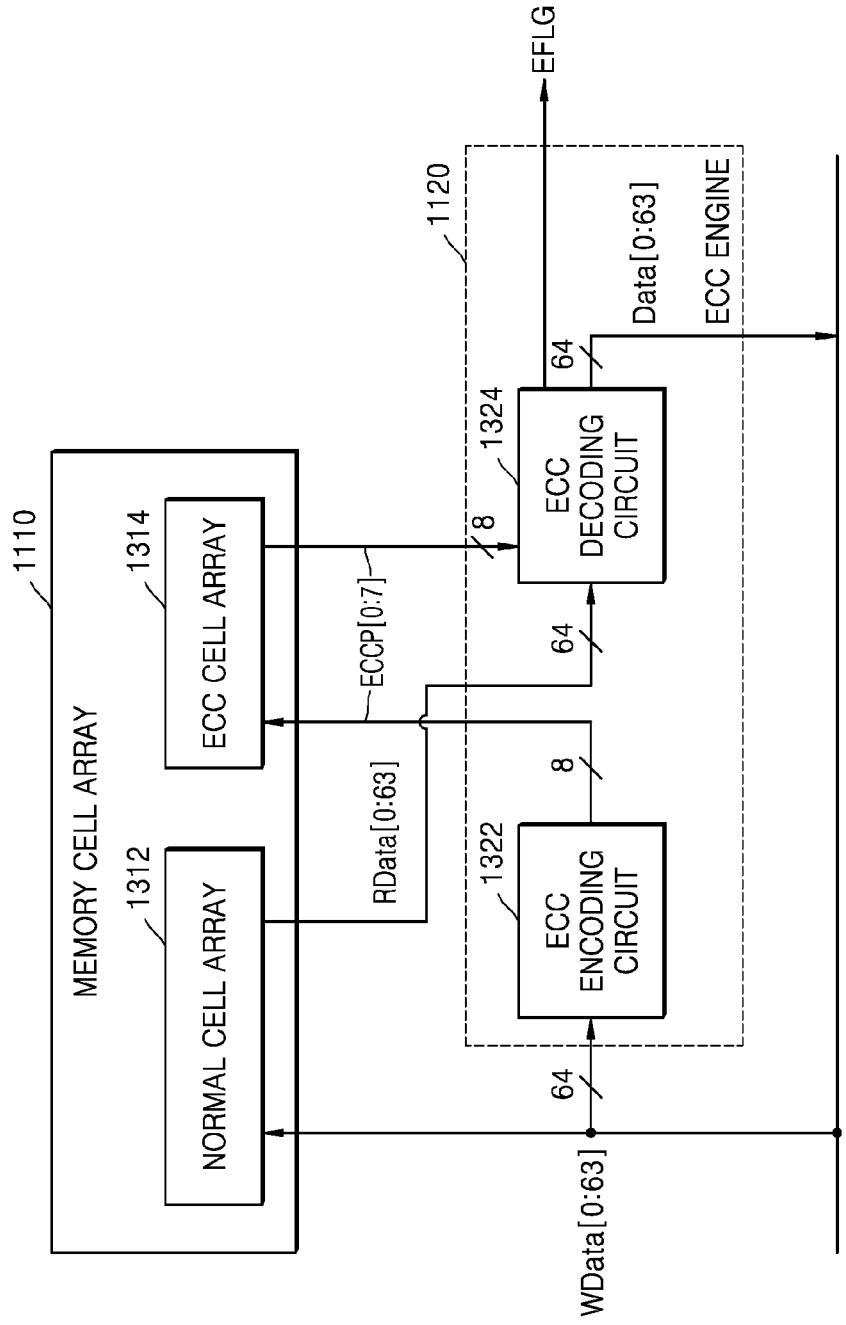
FIG. 13 is a block diagram of an ECC engine of FIG. 11 according to an exemplary embodiment.

FIG. 13 is a block diagram of the ECC engine 1120 of FIG. 11 according to an exemplary embodiment.

Referring to FIG. 13, the ECC engine 1120 may include an ECC encoding circuit 1322 and an ECC decoding circuit 1324. The ECC engine 1120 is different from the ECC engine 120 of FIG. 3 in that the ECC decoding circuit 1324 outputs the ECC flag signal EFLG whenever the error bit is detected and corrected.

The ECC encoding circuit 1322 may generate parity bits ECCP[0:7] related to write data WData[0:63] that is to be written to the memory cells of the memory cell array 1110. The parity bits ECCP[0:7] may be stored in an ECC cell array 1314 of the memory cell array 1110.

The ECC decoding circuit 1324 may correct an error bit included in read data RData[0:63] by using the read data RData[0:63] read from a normal cell array 1312 and the parity bits ECCP[0:7] read from the ECC cell array 1314, and output error corrected data Data[0:63]. In one embodiment, the ECC decoding circuit 1324 may output the ECC flag signal EFLG whenever the error bit is detected and corrected.

Figure 14:
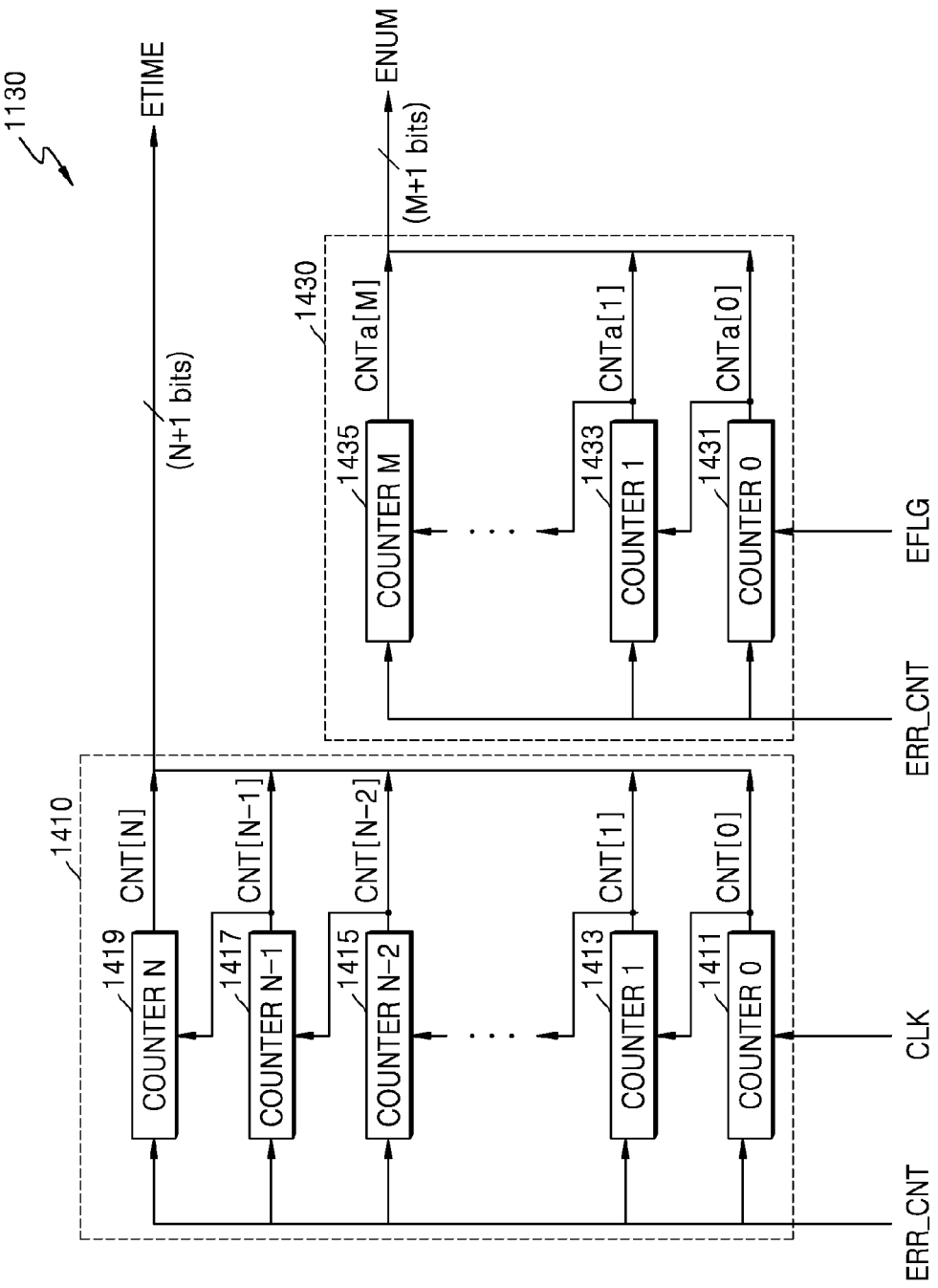
FIG. 14 is a diagram for describing a counter of FIG. 11 according to an exemplary embodiment.

FIG. 14 is a diagram for describing the fail cell counter 1130 of FIG. 11 according to an exemplary embodiment.

Referring to FIG. 14, the fail cell counter 1130 may include an ECC count time generator 1410 that generates the ECC count time ETIME and an ECC operation number generator 1430 that generates the ECC operation number ENUM. The ECC count time generator 1410 and the ECC operation number generator 1430 may respectively reset the ECC count time ETIME and the ECC operation number ENUM in response to the error count command ERR_CNT.

The ECC count time generator 1410 may include first to N-th counters 1411, 1413, 1415, 1417, and 1419 that are connected in series. The first counter 1411 may generate a first bit CNT[0] in response to a clock signal CLK, the second counter 1413 may generate a second bit CNT[1] in response to the first bit CNT[0], an (N−2)-th counter 1415 may generate an (N−2)-th bit CNT[N−2] in response to an (N−3)-th bit, an (N−1)-th counter 1417 may generate an (N−1)-th bit CNT[N−1] in response to the (N−2)-th bit CNT[N−2], and the N-th counter 1419 may generate an N-th bit CNT[N] in response to the (N−1)-th bit CNT[N−1].

The first to N-th bits (CNT[0], CNT[1], . . . , CNT[N−2], CNT[N−1], and CNT[N]) that are respectively generated by the first to N-th counters 1411, 1413, 1415, 1417, and 1419 may be output as the ECC count time ETIME.

The ECC operation number generator 1430 may include first to M-th counters 1431, 1433, and 1435 that are connected in series. The first counter 1431 may generate a first bit CNTa[0] in response to the ECC flag signal EFLG, a second counter 1433 may generate a second bit CNTa[1] in response to the first bit CNTa[0], and the M-th counter 1435 may generate an M-th bit CNTa[M] in response to an (M−1)-th bit. The first to M-th bits (CNTa[0], CNTa[1], . . . , CNTa[M]) that are respectively generated by the first to M-th counters 1431, 1433, and 1435 may be output as the ECC operation number ENUM.

Figure 15:
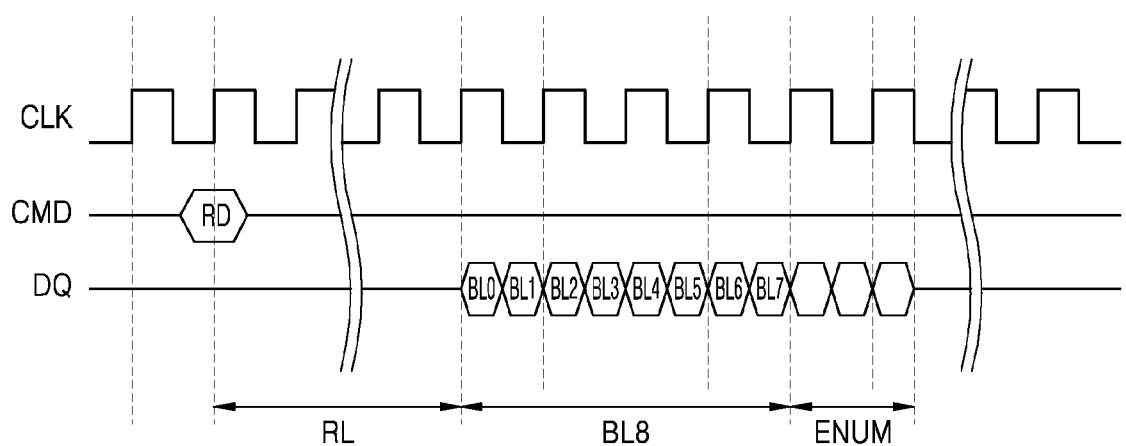
FIG. 15 is a timing diagram of a method of transmitting an ECC operation number of a memory device, according to an exemplary embodiment.

FIG. 15 is a timing diagram of a method of transmitting the ECC operation number ENUM of the memory device 1100, according to an exemplary embodiment.

Referring to FIGS. 11 and 15, the ECC operation number ENUM, which is generated by counting the number of the ECC flag signals EFLG generated during the error monitoring time TEMT in the memory device 1100, may be transmitted to the memory controller or a memory buffer via, for example, a data I/O pin DQ.

The memory device 1100 may receive a read command RD from the memory controller and output read data, which corresponds to a burst length BL after read latency RL through the data I/O pin DQ according to the read command RD that is synchronized with a clock signal CLK. For example, read data BL0 to BL7 that corresponds to a burst length BL=8 may be output through the data I/O pin DQ according to rising and falling edges of the clock signal CLK.

The memory device 1100 may count the number of the ECC flag signals EFLG that is generated during the error monitoring time TEMT and generate the ECC operation number ENUM. The ECC operation number ENUM may be output to the data I/O pin DQ after the read data BL0 to BL7. The ECC operation number ENUM may be output, for example, as 3-bit serial data according to rising and falling edges of the clock signal CLK. According to embodiments, the ECC operation number ENUM may be output as various serial data bits other than the 3-bit serial data. According to embodiments, the ECC operation number ENUM may be output as parallel data bits through a plurality of data I/O pins DQs.

Figure 16:
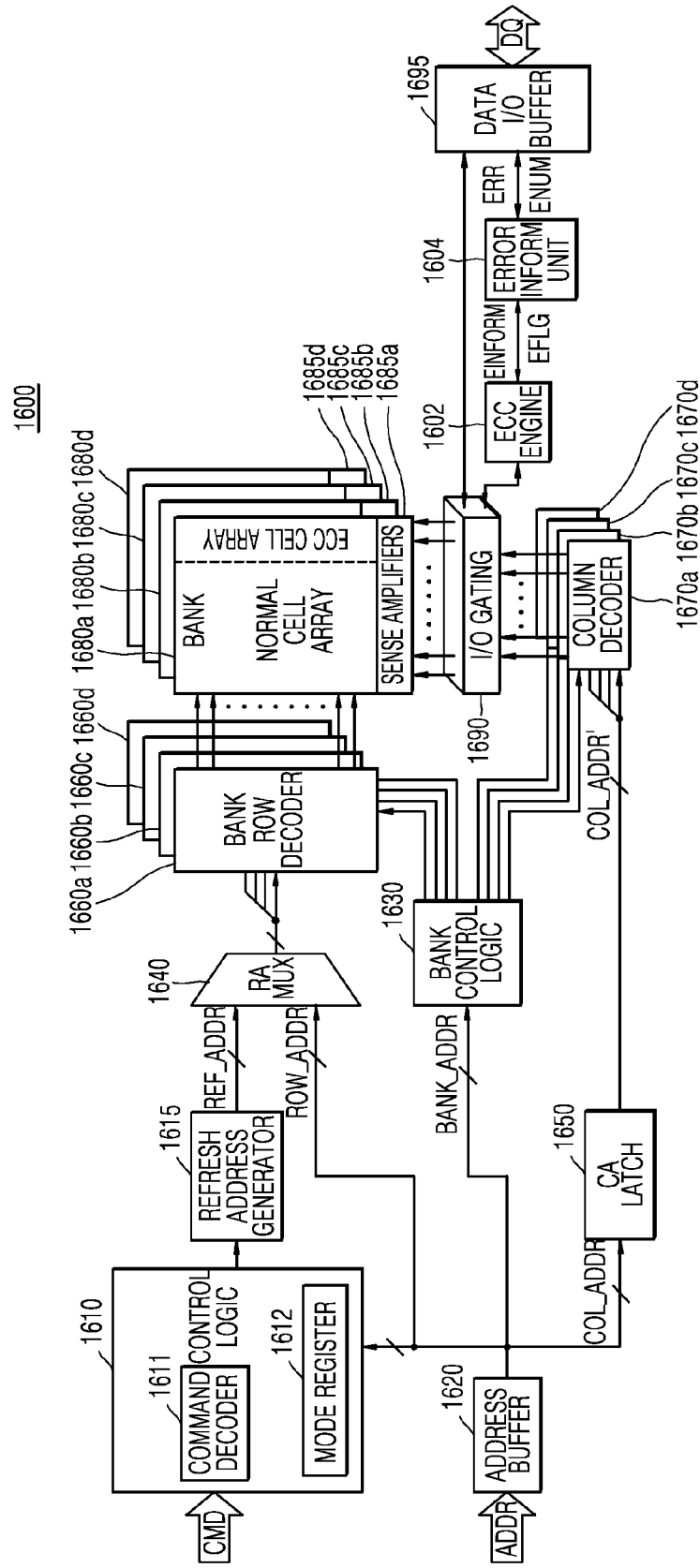
FIG. 16 is a block diagram of a memory device performing an error notification function, according to another exemplary embodiment.

FIG. 16 is a block diagram of a memory device 1600 performing an error notification function, according to another exemplary embodiment.

Referring to FIG. 16, the memory device 1600 may include a control logic circuit 1610, a refresh address generator 1615, an address buffer 1620, a bank control logic circuit 1630, a row address multiplexer 1640, a column address latch 1650, a row decoder, a memory cell array, a sense amplifier, an I/O gating circuit 1690, a data I/O buffer 1695, an ECC engine 1602, and an error notifying circuit 1604.

A memory cell array may include first to fourth bank arrays 1680a, 1680b, 1680c, and 1680d. Each of the first to fourth bank arrays 1680a, 1680b, 1680c, and 1680d may include a normal cell array and an ECC cell array. The normal cell array may include a plurality of normal cells that are arrayed in rows and columns, and the ECC cell array may include a plurality of ECC cells that are arrayed in rows and columns. The ECC cell array may store ECC parity bits that are used for an ECC operation performed according to data provided to/from the normal cells of the normal cell array.

The row decoder may include first to fourth bank row decoders 1660a, 1660b, 1660c, and 1660d that are respectively connected to the first to fourth bank arrays 1680a, 1680b, 1680c, and 1680d. A column decoder may include first to fourth bank column decoders 1670a, 1670b, 1670c, and 1670d that are respectively connected to the first to fourth bank arrays 1680a, 1680b, 1680c, and 1680d. The sense amplifier may include first to fourth bank sense amplifiers 1685a, 1685b, 1685c, and 1685d that are respectively connected to the first to fourth bank arrays 1680a, 1680b, 1680c, and 1680d.

The first to fourth bank arrays 1680a, 1680b, 1680c, and 1680d, the first to fourth bank row decoders 1660a, 1660b, 1660c, and 1660d, the first to fourth bank column decoders 1670a, 1670b, 1670c, and 1670d, and the first to fourth bank sense amplifiers 1685a, 1685b, 1685c, and 1685d may configure first to fourth memory banks, respectively. Although FIG. 16 illustrates an example in which the memory device 1600 includes four memory banks, according to embodiments, the memory device 1600 may include an arbitrary number of memory banks.

Also, according to an embodiment, the memory device 1600 may be DRAM, such as double data rate synchronous DRAM (DDR SDRAM), low power double data rate (LPDDR) SDRAM, graphics double data rate (GDDR) SDRAM, or Rambus DRAM (RDRAM), or a random volatile memory device that requires the ECC operation.

The control logic circuit 1610 may control operations of the memory device 1600. For example, the control logic circuit 1610 may generate control signals so that the memory device 1600 performs a write operation or a read operation. The control logic circuit 1610 may include a command decoder 1611 that decodes the command CMD that is received from the memory controller and a mode register 1612 that sets an operation mode of the memory device 1600.

The command decoder 1611 may decode a write enable signal (/WE), a row address strobe signal (/RAS), a column address strobe signal (/CAS), a chip selecting signal (/CS), and thus, generate a command signal that corresponds to the command CMD. The command decoder 1611 may receive an error count command ERR_CNT from the memory controller.

The mode register 1612 may provide a plurality of operation options of the memory device 1600 and program various functions, properties, and mode of the memory device 1600.

The control logic circuit 1610 may additionally receive differential clocks CLK_t and CLK_c and a clock enable signal CKE for driving the memory device 1600 by using a synchronization method. Data of the memory device 1600 may be operated at a data double rate. The clock enable signal CKE may be captured at a rising edge of the clock signal CLK_t.

The control logic circuit 1610 may control the refresh address generator 1615 in response to a refresh command so that an auto refresh operation is performed, or control the refresh address generator 1615 in response to a self-refresh entry command so that a self-refresh operation is performed.

The refresh address generator 1615 may generate a refresh row address REF_ADDR that corresponds to a memory cell row on which a refresh operation is to be performed. The refresh address generator 1615 may generate the refresh row address REF_ADDR according to a refresh cycle defined in a volatile memory device standard.

The address buffer 1620 may receive an address ADDR that includes a bank address BANK_ADDR, a row address ROW_ADDR, and a column address COL_ADDR from the memory controller. Also, the address buffer 1620 may provide the received bank address BANK_ADDR to the bank control logic circuit 1630, the received row address ROW_ADDR to the row address multiplexer 1640, and the column address COL_ADDR to the column address latch 1650.

The bank control logic circuit 1630 may generate bank control signals in response to the bank address BANK_ADDR. In response to the bank control signals, a bank row decoder that corresponds to the bank address BANK_ADDR may be activated from among the first to fourth bank row decoders 1660*a*, 1660*b*, 1660*c*, and 1660*d*, and a bank column decoder that corresponds to the bank address BANK_ADDR may be activated from among the first to fourth bank column decoders 1670*a*, 1670*b*, 1670*c*, and 1670*d*.

The bank control logic circuit 1630 may generate bank group control signals in response to the bank address BANK_ADDR that determines bank groups. In response to the bank group control signals, row decoders of a bank group corresponding to the bank address BANK_ADDR may be activated from among the first to fourth bank row decoders 1660*a*, 1660*b*, 1660*c*, and 1660*d*, and column decoders of a bank group corresponding to the bank address BANK_ADDR may be activated from among the first to fourth bank column decoders 1670*a*, 1670*b*, 1670*c*, and 1670*d*.

The row address multiplexer 1640 may receive the row address ROW_ADDR from the address buffer 1620, and a refresh row address REF_ADDR from the refresh address generator 1615. The row address multiplexer 1640 may selectively output the row address ROW_ADDR or the refresh row address REF_ADDR. A row address that is output from the row address multiplexer 1640 may be applied to each of the first to fourth bank row decoders 1660*a*, 1660*b*, 1660*c*, and 1660*d*.

From among the first to fourth bank row decoders 1660*a*, 1660*b*, 1660*c*, and 1660*d*, the bank row decoder that is activated by the bank control logic circuit 1630 may decode the row address that is output from the row address multiplexer 1640, and thus, activate a word line that corresponds to the row address. For example, the activated bank row decoder may apply a word line driving voltage to the world line that corresponds to the row address.

The column address latch 1650 may receive the column address COL_ADDR from the address buffer 1620 and temporarily store the received column address COL_ADDR. The column address latch 1650 may gradually increase the received column address COL_ADDR in a burst mode. The column address latch 1650 may apply the temporarily stored or gradually increased column address COL_ADDR' to each of the first to fourth bank column decoders 1670*a*, 1670*b*, 1670*c*, and 1670*d*.

From among the first to fourth bank column decoders 1670*a*, 1670*b*, 1670*c*, and 1670*d*, the bank column decoder that is activated by the bank control logic circuit 1630 may activate sense amplifiers that respectively correspond to the bank address BANK_ADDR and the column address COL_ADDR' via the I/O gating circuit 1690.

The I/O gating circuit 1690 may include not only circuits for gating I/O data, but also an input data mask logic circuit, read data latches for storing data output from the first to fourth bank arrays 1680*a*, 1680*b*, 1680*c*, and 1680*d*, and a write driver for writing data to the first to fourth bank arrays 1680*a*, 1680*b*, 1680*c*, and 1680*d*.

Write data, which is to be written to a memory cell array of a bank array selected from the first to fourth bank arrays 1680*a*, 1680*b*, 1680*c*, and 1680*d*, may be provided to the data I/O buffer 1695 from the memory controller via the memory buffer. The write data provided to the data I/O buffer 1695 may be written to the bank array via the write driver. The write data provided to the data I/O buffer 1695 may be transmitted to the ECC engine 1602. The ECC engine 1602 may generate parity bits related to data to be written to the normal cell array. The parity bits generated by the ECC engine 1602 may be stored in an ECC cell array of the bank array to which the write data is written.

The data that is read from a normal cell array of the bank array selected from the first to fourth bank arrays 1680*a*, 1680*b*, 1680*c*, and 1680*d* and the parity bits read from the ECC cell array may be sense-amplified by the sense amplifier and stored in the read data latches. The data stored in the read data latches may be transmitted to the data I/O buffer 1695 and provided to the memory controller via the memory buffer. Also, the data stored in the read data latches may be transmitted to the ECC engine 1602. The ECC engine 1602 may detect and correct an error bit included in the data read from the normal cell array by using the parity bits.

The ECC engine 1602 may output error information EINFORM that corresponds to the error bit corresponding to a particular address or generate an ECC flag signal EFLG whenever the error bit is detected and corrected. The error information EINFORM or the ECC flag signal EFLG may be transmitted to the error notifying circuit 1604.

If the particular address is not the same as any one of the existing one or more failed addresses, the error notifying circuit 1604 may output an error signal ERR. The error notifying circuit 1604 may count the number of the ECC flag signals EFLG and generate an ECC operation number ENUM. If the ECC operation number ENUM is greater than an ECC operation maximum EMAX, the error signal ERR may be output. If an ECC count time ETIME, which refers to a period of the ECC operation, is greater than an error monitoring time TEMT, the error notifying circuit 1604 may output the ECC operation number ENUM. The error signal ERR and the ECC operation number ENUM may be output to a data I/O pin DQ via the data I/O buffer 1695.

Figure 17:
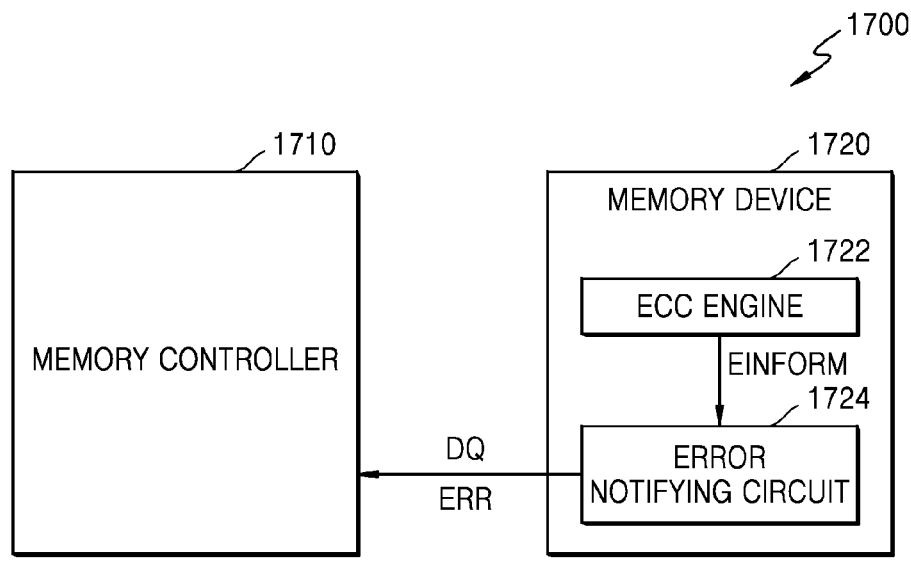
FIG. 17 is an exemplary diagram of a memory system according to certain exemplary embodiment.

FIG. 17 is an exemplary diagram of a memory system 1700 according to exemplary embodiments.

Referring to FIG. 17, the memory system 1700 includes a memory controller 1710 and the memory device 1720. The memory device 1720 may include an ECC engine 1722 and an error notifying circuit 1724. The ECC engine 1722 may perform an ECC operation on a first set of memory cells of a memory cell array corresponding to a particular address in the memory device 1720. The ECC engine 1722 may output error information EINFORM that corresponds to an error bit corresponding to the particular address that is corrected by the ECC operation.

The error notifying circuit 1724 may compare the particular address and one of the existing one or more failed addresses. If the particular address is not the same as any one of the existing one or more failed addresses according to a comparison result, the error notifying circuit 1724 may output an error signal ERR. Otherwise, if the particular address is the same as one of the existing one or more failed addresses, the error notifying circuit 1724 may output the error signal ERR if an error bit is a 2-bit error. The existing one or more failed addresses of corresponding one or more failed cells that are repaired during a testing process of a manufacturing process of the memory device 1720 and may be stored in a storing circuit that may be one-time programmable memory, such as an anti-fuse array, or a non-volatile memory cell array.

The memory device 1720 may output the error signal ERR, which informs that the particular address of the error bit corrected by the ECC operation is not the same as any one of the existing one or more failed addresses but is a newly added failed address, to the memory controller 1710.

The memory device 1720 may output the error signal ERR to the memory controller 1710 via a data I/O pin DQ.

The memory controller 1710 may monitor a generation frequency of the received error signal ERR and determine whether or not the memory device 1720 is appropriate for usage. If the memory device 1720 is not appropriate for usage according to a determination result, the memory device 1720 may be replaced. Therefore, since the memory device 1720 may be replaced before the memory device 1720 malfunctions, the memory system 1700, including the memory device 1720, may be stabilized.

Figure 18:
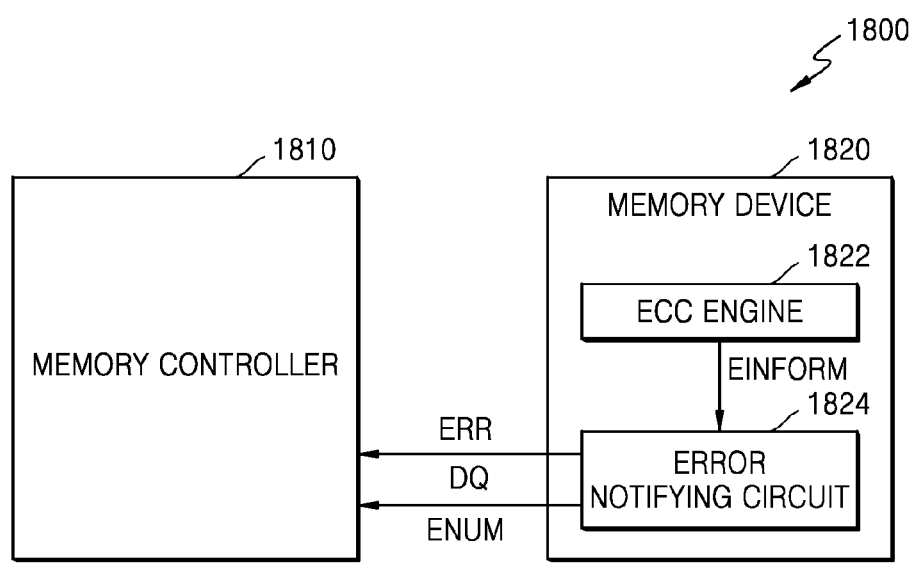
FIG. 18 is an exemplary diagram of a memory system according to certain exemplary embodiment.

FIG. 18 is an exemplary diagram of a memory system 1800 according to exemplary embodiments.

Referring to FIG. 18, the memory system 1800 includes a memory controller 1810 and the memory device 1820. The memory controller 1810 may provide an error count command ERR_CNT to the memory device 1820 to obtain information regarding failed cells that are repaired by an ECC operation that is internally performed by the memory device 1820 to detect and correct an error bit. The memory device 1820 may output an error signal ERR to the memory controller 1810 according to an ECC operation number that is generated whenever the error bit is detected and corrected by performing the ECC operation.

The memory device 1820 may include an ECC engine 1822 and an error notifying circuit 1824. The ECC engine 1822 may output an ECC flag signal EFLG whenever the error bit is detected and corrected by performing the ECC operation. An ECC operation number ENUM may be output by counting the number of the ECC flag signals EFLG, and the duration of counting the ECC flag signal EFLG may be output as an ECC count time.

The error notifying circuit 1824 may compare the ECC operation number ENUM with a maximum number of the ECC operations. If the ECC operation number ENUM is greater than the maximum number of the ECC operations, an error signal ERR may be output. The error signal ERR may be a signal that informs that a large number of uncorrectable error bits has been generated in the memory device 1820. The error notifying circuit 1824 may compare the ECC count time with an error monitoring time, and when the ECC count time is greater than the error monitoring time, an ECC operation number ENUM generated during the error monitoring time may be output.

The memory device 1820 may output the error signal ERR and the ECC operation number ENUM during the error monitoring time to the memory controller 1810 via a data I/O pin DQ. If the memory device 1820 is not appropriate for operations of a system, based on the received error signal ERR and the received ECC operation number ENUM, the memory controller 1810 may replace the memory device 1820. Therefore, since the memory device 1820 may be replaced before the memory device 1820 malfunctions, the memory system 1800, including the memory device 1820, may be stabilized.

Figure 19:
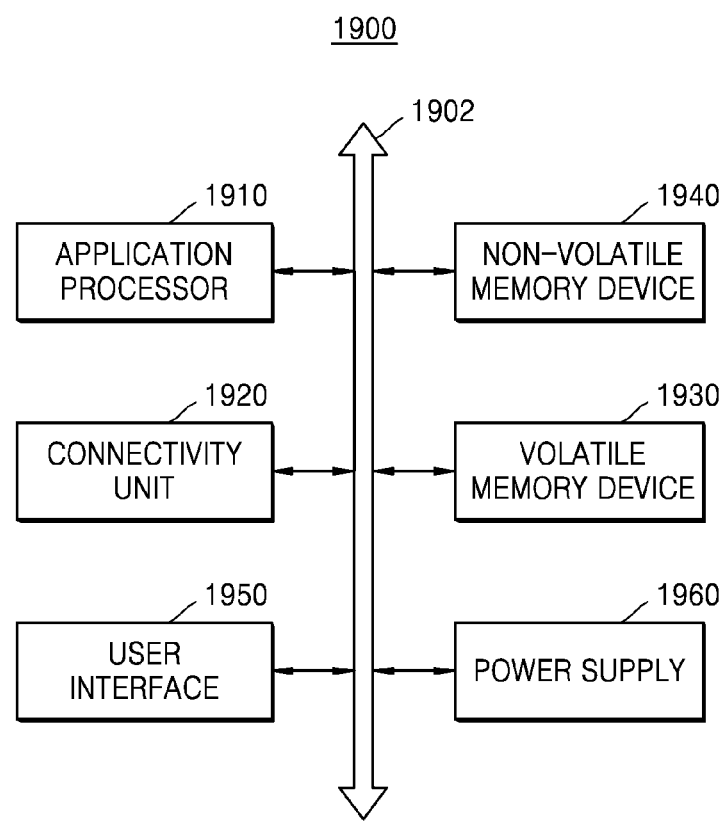
FIG. 19 is a block diagram of a mobile system according to certain exemplary embodiment.

FIG. 19 is a block diagram of a mobile system 1900 according to certain exemplary embodiment.

Referring to FIG. 19, the mobile system 1900 may include an application processor 1910, a connectivity unit 1920, a first memory device 1930, a second memory device 1940, a user interface 1950, and a power supply 1960 that are connected to each other via a bus 1902. The first memory device 1930 may be a volatile memory device and the second memory device 1940 may be a non-volatile memory device. According to an embodiment, the mobile system 1900 may be any arbitrary mobile system, such as a mobile phone, a smart phone, a personal digital assistant (PDA), a portable multimedia player (PMP), a digital camera, a music player, a portable game console, or a navigation system.

The application processor 1910 may execute applications that provide Internet browsers, games, videos, etc. According to an embodiment, the application processor 1910 may include a single core or multiple cores. For example, the application processor 1910 may include dual-core processors, quad-core processors, or hexa-core processors. Also, according to an embodiment, the application processor 1910 may include an internal or external cache memory.

The connectivity unit 1920 may perform wired or wireless communication with an external device. For example, the connectivity unit 1920 may perform Ethernet communication, Near Field Communication (NFC), Radio Frequency Identification (RFID) communication, mobile telecommunication, memory card communication, or Universal Serial Bus (USB) communication. For example, the connectivity unit 1920 may include a baseband chipset and support communication standards such as GSM, GRPS, WCDMA, or HSxPA.

The first memory device 1930, which is a volatile memory device, may store data processed by the application processor 1910 or operate as a working memory. The first memory device 1930 may include a memory cell array including a plurality of memory cells, an ECC engine that performs an ECC operation on a first set of memory cells of the memory cell array corresponding to a particular address, and outputs an error address that corresponds to an error bit corrected by the ECC operation, and an error notifying circuit that compares the particular address and existing one or more failed addresses and outputs an error signal if the particular address is not the same as any one of the existing one or more failed addresses.

Alternatively, the first memory device 1930 may include a memory cell array including a plurality of memory cells, an ECC engine that performs an ECC operation on the memory cells and outputs an ECC flag signal whenever an error bit is detected and corrected by the ECC operation, and an error notifying circuit that outputs an error signal when an ECC operation number, which is generated by counting the number of the ECC flag signals, is greater than an ECC operation maximum and outputs an ECC operation number during an error monitoring time.

The first memory device 1930 may output an error signal so that an error situation is detected by the mobile system 1900 while the first memory device 1930 is being used in the mobile system 1900. Accordingly, when the first memory device 1930 is not appropriate for the operations of the mobile system 1900, based on the error signal and the ECC operation number, the mobile system 1900 may replace the first memory device 1930. Therefore, since the first memory device 1930 may be replaced before the first memory device 1930 malfunctions, the mobile system 1900, including the first memory device 1930, may be stabilized.

The second memory device 1940, which is a non-volatile memory device, may store a boot image for booting the mobile system 1900. For example, the second memory device 1940 may be provided as electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), or the like.

The user interface 1950 may include at least one input device, such as a keypad or a touch screen, and/or at least one output device, such as a speaker or a display device. A driving voltage may be applied to the power supply 1960. Also, according to an embodiment, the mobile system 1900 may further include a camera image processor (CIP), and a storage device, such as a memory card, a solid state drive (SSD), a hard disk drive (HDD), or a CD-ROM.

Figure 20:
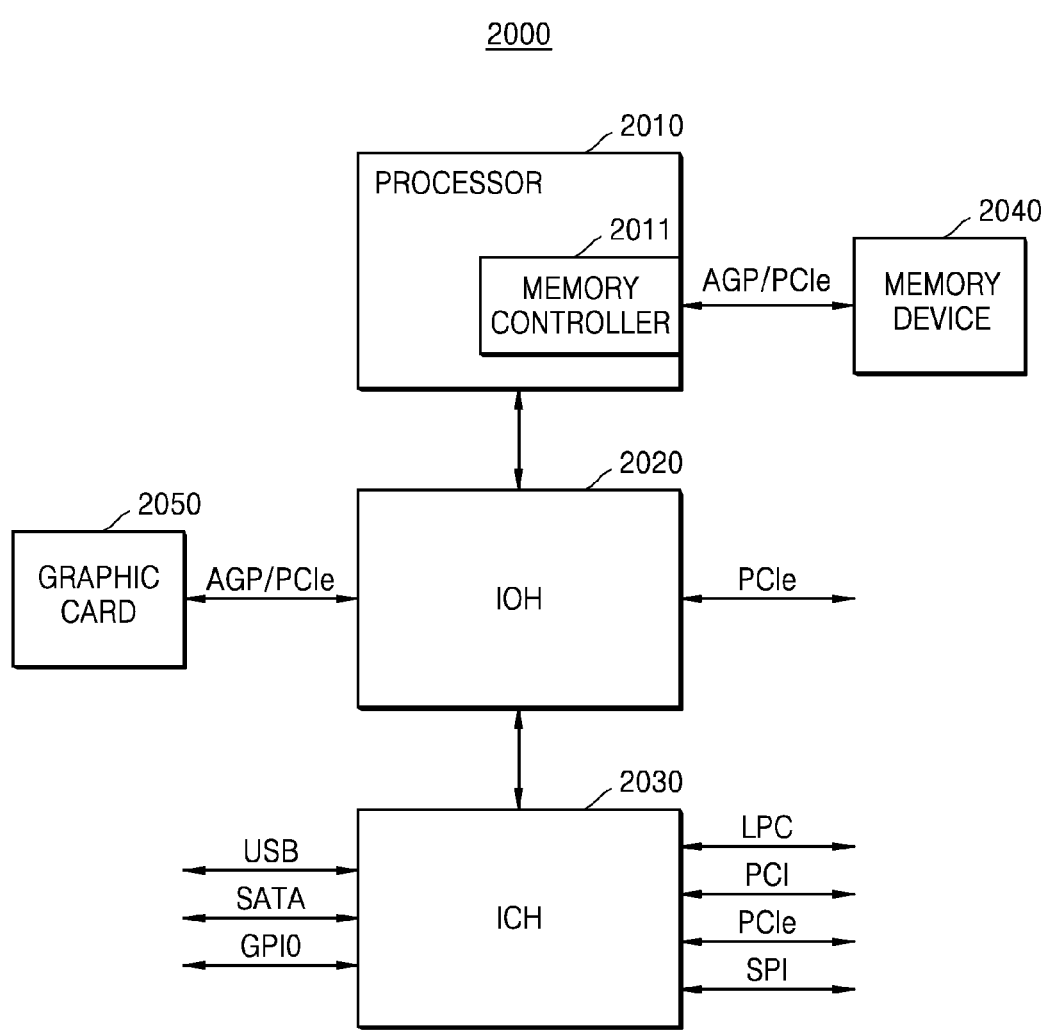
FIG. 20 is a block diagram of a computing system according to certain exemplary embodiment.

FIG. 20 is a block diagram of a computing system 2000 according to an exemplary embodiment.

Referring to FIG. 20, the computing system 2000 includes a processor 2010, an I/O hub 2020, an I/O controller hub 2030, the memory device 2040, and a graphics card 2050. According to an embodiment, the computing system 2000 may be any arbitrary computing system, such as a personal computer (PC), a server computer, a workstation, a laptop, a mobile phone, a smart phone, a PDA, a PMP, a digital camera, a digital TV, a set-top box, a music player, a portable game console, or a navigation system.

The processor 2010 may perform various computing functions, such as calculations or tasks. For example, the processor 2010 may be a microprocessor or a central processing circuit (CPU). According to an embodiment, the processor 2010 may include a single core or multiple cores. For example, the processor 2010 may include dual-core, quad-core, or hexa-core processors. Also, although FIG. 20 illustrates that the computing system 2000 includes only one processor, according to exemplary embodiments, the computing system 2000 may include a plurality of processors. Also, according to exemplary embodiments, the processor 2010 may further include an internal or external cache memory.

The processor 2010 may include a memory controller 2011 that controls operations of the memory device 2040. The memory controller 2011 included in the processor 2010 may be referred to as an integrated memory controller (IMC). According to an embodiment, the memory controller 2011 may be located in the I/O hub 2020. The I/O hub 2020 that includes the memory controller 2011 may be referred to as a memory controller hub (MCH).

The memory device 2040 may include a memory cell array including a plurality of memory cells, an ECC engine that performs an ECC operation on the memory cells and outputs error information that corresponds to an error bit corresponding to a particular address corrected by the ECC operation, and an error notifying circuit that compares the particular address and existing one or more failed addresses and outputs an error signal if the particular address is not the same as one of the existing one or more failed addresses.

The memory device 2040 may include a memory cell array including a plurality of memory cells, an ECC engine that performs an ECC operation on the memory cells and outputs an ECC flag signal whenever an error bit is detected and corrected by the ECC operation, and an error notifying circuit that outputs an error signal if an ECC operation number, which is generated by counting the number of the ECC flag signals, is greater than an ECC operation maximum and outputs an ECC operation number during an error monitoring time.

The memory device 2040 may output an error signal so that an error situation is detected by the computing system 2000 while the memory device 2040 is being used in the computing system 2000. Accordingly, if the memory device 2040 is not appropriate for the operations of the computing system 2000, based on the error signal and the ECC operation number, the computing system 2000 may replace the memory device 2040. Therefore, since the memory device 2040 may be replaced before the memory device 2040 malfunctions, the computing system 2000, including the memory device 2040, may be stabilized.

The I/O hub 2020 may manage data transmission between devices, such as the graphics card 2050, and the processor 2010. The I/O hub 2020 may be connected to the processor 2010 via various types of interfaces. For example, the I/O hub 2020 and the processor 2010 may be connected via various standards of interfaces, for example, Front Side Bus (FSB), system bus, HyperTransport, Lightning Data Transport (LDT), QuickPath Interconnect (QPI), Common System Interface (CSI), or Peripheral Component Interface Express (PCIe) interface. Although FIG. 20 illustrates that the computing system 2000 includes only one I/O hub, according to exemplary embodiments, the computing system 2000 may include a plurality of I/O hubs.

The I/O hub 2020 may provide an interface for various devices. For example, the I/O hub 2020 may provide an Accelerated Graphics Port (AGP) interface, a PCIe interface, or a Communication Streaming Architecture (CSA) interface.

The graphics card 2050 may be connected to the I/O hub 2020 via AGP or PCIe. The graphics card 2050 may control a display device (not shown) for displaying images. The graphics card 2050 may include an internal processor for processing image data and an internal semiconductor memory device. According to an embodiment, the I/O hub 2020 may include a graphics device therein together with or instead of the graphics card 1150 disposed outside the I/O hub 2020. The graphics device included in the I/O hub 2020 may be referred to as integrated graphics. Also, the I/O hub 2020 that includes the memory controller and the graphics device may be referred to as a Graphics and Memory Controller Hub (GMCH).

The I/O controller hub 2030 may perform data buffering and interface arbitration so that various system interfaces operate efficiently. The I/O controller hub 2030 may be connected to the I/O hub 2020 via an internal bus. For example, the I/O hub 2020 and the I/O controller hub 2030 may be connected via Direct Media Interface (DMI), hub interface, Enterprise Southbridge interface (ESI), or PCIe.

The I/O controller hub 2030 may provide various interfaces for peripheral devices. For example, the I/O controller hub 2030 may provide a USB port, a Serial Advanced Technology Attachment (SATA) port, a general purpose input/output (GPIO) port, a Low Pin Count (LPC) bus, a Serial Peripheral Interface (SPI), a PCI interface, or a PCIe interface.

According to an embodiment, at least two selected from the processor 2010, the I/O hub 2020, and the I/O controller hub 2030 may be formed as a single chipset. While the present disclosure has been particularly shown and described with reference to exemplary embodiments thereof, it will be understood that various changes in form and details may be made therein without departing from the spirit and scope of the following claims.

What is claimed is:

1. A memory device comprising:
    a memory cell array comprising a plurality of memory cells;
    a storing circuit configured to store one or more failed addresses corresponding to one or more failed cells of the plurality of memory cells;
    an error correction code (ECC) engine configured to detect and correct an error bit related to data of a first set of memory cells of the memory cell array corresponding to a particular address, and output error information corresponding to the error bit corresponding to the particular address; and an error notifying circuit configured to output an error signal when the particular address is not the same as one of the one or more failed addresses, wherein the error notifying circuit is configured to output the error signal to an outside of the memory device via one of a data input/output pin and a dedicated pin of the memory device.

2. The memory device of claim 1, wherein the one or more failed addresses are determined during a testing process of a manufacturing process of the memory device.

3. The memory device of claim 1, wherein the storing circuit is a one-time programmable memory including an anti-fuse array, an electrically programmable fuse array, laser programmable fuse array, or a non-volatile memory cell array.

4. The memory device of claim 1, wherein the error information includes whether the ECC engine has detected and corrected the error bit and whether the first set of memory cells includes more than one bit error.

5. The memory device of claim 1, wherein the error notifying circuit is configured to output the error signal when the particular address is the same as one of the one or more failed address, and the first set of memory cells includes more than one bit error.

6. The memory device of claim 1, further comprising:
a counter configured to count a number of times of the detected and corrected an error bit during a first period of time,
wherein the error notifying circuit is configured to output an error signal when the number of times of the detected and corrected an error bit is greater than a reference value.

7. The memory device of claim 6, wherein the error notifying circuit is configured to output the number of times of the detected and corrected an error bit to an outside of the memory device through one of a data input/output pin and a dedicated pin of the memory device.

8. A method of operating a memory device including a memory cell array, the method comprising:
storing one or more failed address corresponding to one or more failed cells of the memory cell array;
by using an error correction code (ECC) circuit, detecting and correcting an error bit related to data of a first set of memory cells of the memory cell array corresponding to a first address, and outputting error information corresponding to the first address;
outputting an error signal when the first address is not the same as one of the one or more failed address;
counting a number of times of the detecting and correcting an error bit during a first period of time; and
outputting an error signal when the number of times of the detecting and correcting an error bit is greater than a reference value.

9. The method of claim 8, wherein the one or more failed addresses are determined during a testing process of a manufacturing process of the memory device.

10. The method of claim 8, wherein outputting the error signal comprises outputting the error signal to an outside of the memory device via one of a data input/output pin and a dedicated pin of the memory device.

11. The method of claim 8, further comprising:
outputting the error signal when the first address is the same as one of the one or more failed addresses, and the first set of memory cells includes more than one bit error.

12. The method of claim 8, wherein the error information includes whether the detecting and correcting the error bit has been performed and whether the first set of memory cells includes more than one bit error.

13. A method of operating a memory device including a memory cell array, the method comprising:
determining one or more failed addresses corresponding to one or more failed cells of the memory cell array by a test operation of the memory device;
by using an error correction code (ECC) circuit, detecting and correcting an error bit related to data of a first set of memory cells of the memory cell array corresponding to a first address;
outputting an error signal when the first address is not the same as one of the one or more failed addresses, or when the first address is the same as one of the one or more failed addresses and the first set of memory cells includes more than one bit error;
counting a number of times of the detecting and correcting an error bit during a first period of time; and
after the first period of time, outputting the number of times of the detecting and correcting an error bit to an outside of the memory device through one of a data input/output pin and a dedicated pin of the memory device.

14. The method of claim 13, further comprising:
outputting error information corresponding to the first address by using the ECC circuit,
wherein the error information includes whether the detecting and correcting the error bit has been performed and whether the first set of memory cells includes more than one bit error.

15. The method of claim 13, wherein outputting the error signal comprises outputting the error signal to an outside of the memory device through one of a data input/output pin and a dedicated pin of the memory device.

16. The method of claim 13, further comprising:
outputting an error signal when the number of times of the detecting and correcting an error bit is greater than a reference value.

* * * * *